(12) United States Patent
Kuo et al.

(10) Patent No.: US 8,525,300 B2
(45) Date of Patent: Sep. 3, 2013

(54) TUNABLE ESD PROTECTION DEVICE

(75) Inventors: Hsi-Yu Kuo, Hsinchu (TW); Chi-Kuang Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/469,923

(22) Filed: May 11, 2012

(65) Prior Publication Data

US 2013/0082353 A1    Apr. 4, 2013

Related U.S. Application Data

(60) Provisional application No. 61/540,887, filed on Sep. 29, 2011.

(51) Int. Cl.
*H01L 29/73* (2006.01)
(52) U.S. Cl.
USPC .............. 257/591; 257/592; 257/E29.174
(58) Field of Classification Search
USPC ................... 257/591, 592, E29.174
See application file for complete search history.

(56) References Cited

U.S. PATENT DOCUMENTS

2002/0195684 A1* 12/2002 Leitch .......................... 257/592

* cited by examiner

*Primary Examiner* — Zandra Smith
*Assistant Examiner* — Paul Patton
(74) *Attorney, Agent, or Firm* — Haynes and Boone, LLP

(57) ABSTRACT

The present disclosure provides an ESD protection device. The device contains a bipolar junction transistor device that includes a collector, a base, and an emitter. The collector includes a first doped element and a more heavily doped second doped element disposed over the first doped element. The first and second doped elements each have a first doping polarity. The base is located adjacent to the collector and includes a third doped element having a second doping polarity different from the first doping polarity. A p-n junction is formed between the third doped element and one of the first and second doped elements. The emitter is formed over the base. The emitter includes a fourth doped element having the first doping polarity and forming a p-n junction with the third doped element. The fourth doped element is more heavily doped than the third doped element.

20 Claims, 19 Drawing Sheets

TUNABLE ESD PROTECTION DEVICE

PRIORITY DATA

The present application claims priority to U.S. Provisional Application Ser. No. 61/540,887, filed Sep. 29, 2011, the disclosure of which is incorporated herein by reference in its entirety.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

Electrostatic discharge (ESD) is an important concern for ICs. If not handled properly, an ESD event can result in a high voltage that could damage components on the IC. To prevent such ESD damage, many modern day ICs are equipped with an ESD protection device. The ESD protection device is operable to divert electrical current away from other components on the IC during an ESD event, thereby protecting these components from being damaged by the ESD event. Unfortunately, existing ESD protection devices often suffer from drawbacks such as excessive chip area consumption, degraded performance for applications with noisy power, and lack of tunability which may result in circuit design problems.

Therefore, while existing ESD protection devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

There are many causes for an electrostatic discharge (ESD) event. For example, an ESD event may be trigged by static electricity, which is often generated simply by bringing two materials into contact and then separating them. Daily tasks such as hair combing or walking on carpet can be sources of static electricity. As another example, electrostatic induction can also trigger an ESD event. Electrostatic induction may occur when an electrically-floating conductive object and an electrically charged object are placed near each other.

When triggered, an ESD event may cause an excessively large amount of electrical current to flow through an IC chip, which can potentially damage internal circuitry on the IC chip. To protect the internal circuitry on the IC chip, various types of ESD protection devices are utilized to divert current away from the internal circuitry during an ESD event. One type of ESD protection device includes dynamically triggered Metal Oxide Semiconductor (MOS) devices (also referred to as RC-MOS ESD devices). However, these triggered MOS ESD protection devices typically consume a large amount of valuable chip area and are not best equipped to handle high voltage technology nodes or noisy applications. Another type of ESD protection device includes breakdown mode devices. These devices may be based on NMOS transistors, Bipolar Junction Transistors (BJTs), or Silicon Controlled Rectifiers (SCRs). Compared to RC-MOS ESD devices, the breakdown mode devices typically have smaller chip area consumption and reduced leakage performance. However, existing breakdown mode ESD protection devices lack tunability and may not meet design window specification limits.

According to various aspects of the present disclosure, an improved ESD protection device is provided that offers small chip area consumption, adjustable device characteristics by layout, a wider tuning range, and a latch-up free performance.

Figure 1:
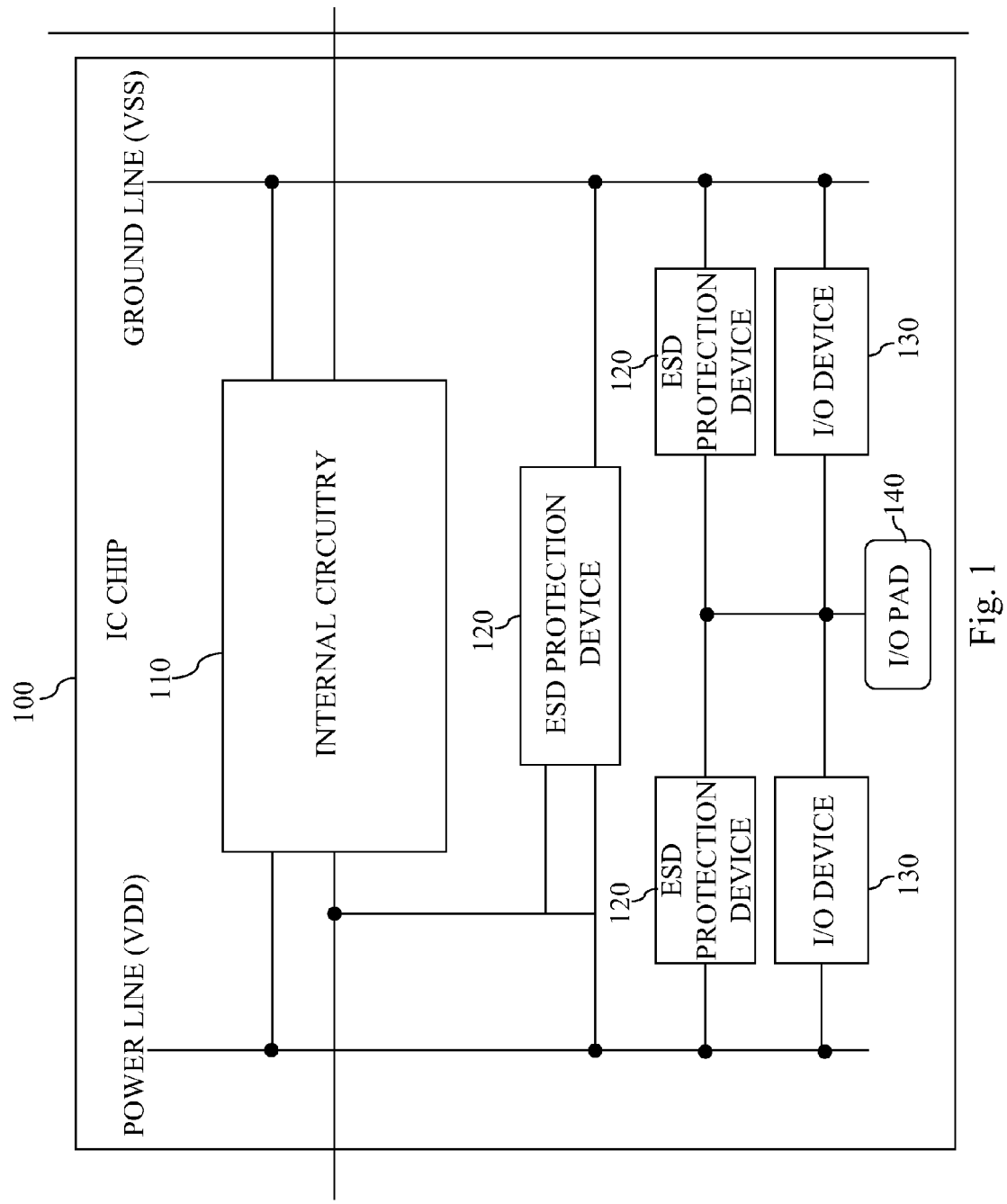
FIG. 1 is a simplified block diagram of an IC chip.

FIG. 1 illustrates a simplified block diagram of an IC chip 100. The IC chip contains internal circuitry 110. The internal circuitry may include memory circuits, logic circuits, analog circuits, high frequency circuits, power circuits, and other suitable electronic circuits. These circuits may be implemented using a plurality of passive components such as resistors, capacitors, and inductors, and active components such as P-channel field effect transistors (pFETs), N-channel FETs (nFETs), metal-oxide semiconductor field effect transistors (MOSFETs), or complementary metal-oxide semiconductor (CMOS) transistors.

The IC chip also contains one or more ESD protection devices 120. In the embodiments illustrated herein, each ESD protection device 120 is a breakdown mode device and may include a BJT device. In alternative embodiments, the ESD protection device 120 may also include other types of suitable devices. The input of one or more of the ESD protection devices 120 is electrically coupled to the internal circuitry 110, so that these ESD protection device 120 can shunt current with the internal circuitry 110. Both the internal circuitry 110 and one or more of the ESD protection devices 120 may be electrically coupled to a power line (e.g., VDD) as well as a ground line (e.g., VSS). Some of the ESD protection devices 120 may also be electrically coupled in parallel with one or more input/output (I/O) devices 130. Some of these I/O devices 130 and some of the ESD protection devices 120 may also be electrically coupled to an I/O pad 140, as is shown in FIG. 1.

During normal operation of the IC chip (i.e., an ESD-free environment), the ESD protection devices 120 are turned off, and thus its existence may be effectively ignored by the internal circuitry. When an ESD event occurs, however, the ESD protection devices 120 turn on and diverts incoming electrical current away from the internal circuitry 110.

FIGS. 2 to 11 are diagrammatic fragmentary cross-sectional side views of different embodiments of the ESD protection device 120 according to various aspects of the present disclosure. For reasons of clarity and consistency, similar components of these embodiments will be labeled the same throughout FIGS. 2-7. It is also understood that the cross-sectional Figures herein illustrate only a portion of the ESD protection device for the sake of simplicity, and that the ESD protection device may contain additional features that are not shown herein.

Figure 2:
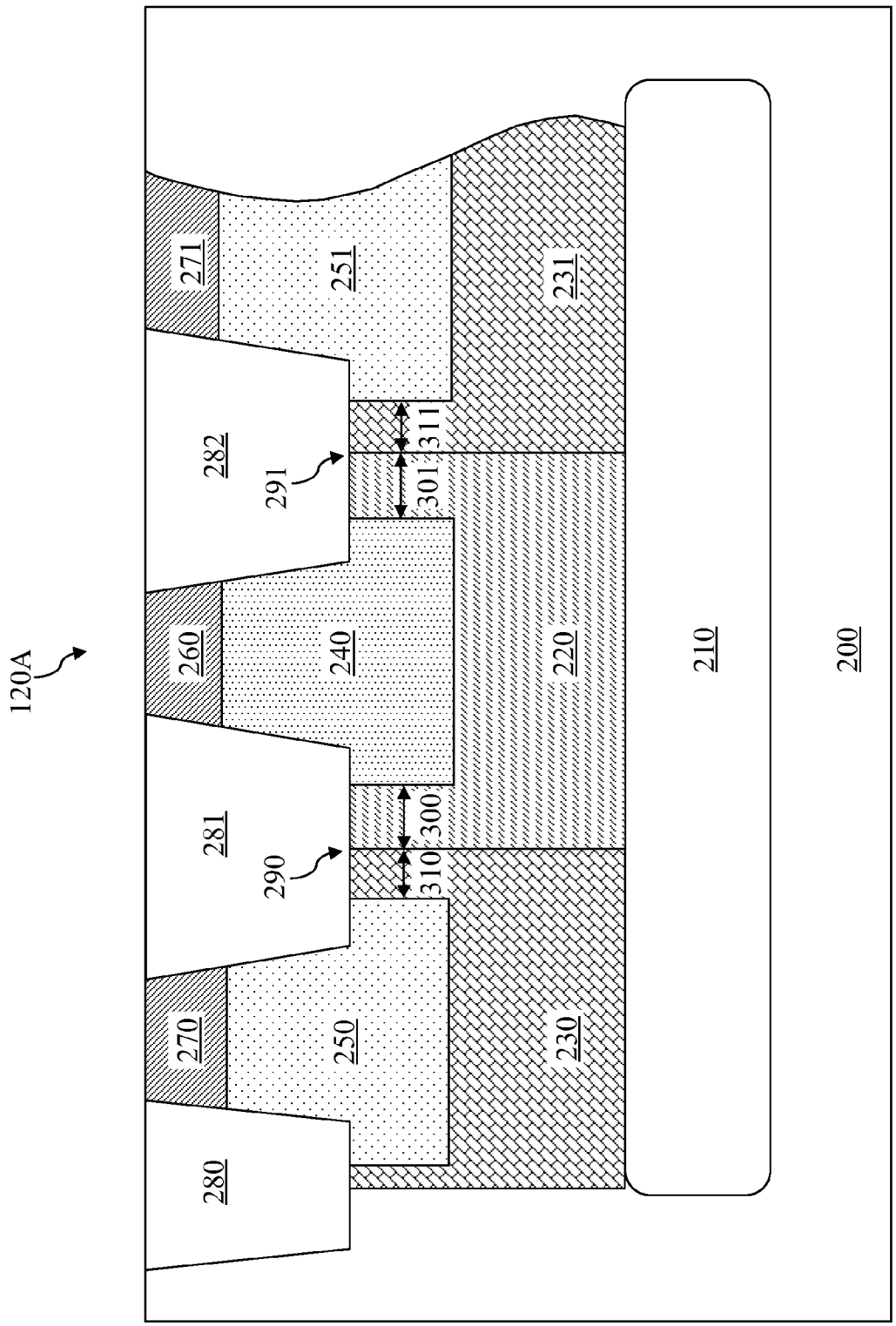
FIGS. 2-11 are simplified cross sectional views of different embodiments of a semiconductor device according to various aspects of the present disclosure.

Referring to FIG. 2, an ESD protection device 120A includes a substrate 200. The substrate 200 may have various doping configurations depending on design requirements known in the art. In the illustrated embodiments, the substrate 200 includes a crystal silicon material. Alternatively, the substrate 200 may also include other elementary semiconductors such as germanium and diamond. Furthermore, in some embodiments, the substrate 200 may include a compound semiconductor and/or an alloy semiconductor.

The ESD protection device 120A includes a buried layer 210 formed in the substrate 200. The buried layer 210 may also be referred to as a deep well. The buried layer 210 may be formed by one or more ion implantation processes known in the art, in which a plurality of dopant ions are implanted to the substrate 200. In the embodiment illustrated, the buried layer 210 is doped with an n-type dopant, such as Arsenic, Phosphorous or Antimony. Thus, the buried layer 210 may also be referred to as an n-type buried layer (NBL) or a deep n-well (DNW). In some embodiments, the buried layer 210 has a doping concentration that is in a range from about $1.0 \times 10^{17}$ ions/cm$^3$ to about $1.0 \times 10^{21}$ ions/cm$^3$. It is understood, however, that the values recited herein are merely examples and may be changed in different embodiments.

The ESD protection device 120A includes a high voltage well 220 that is formed over the buried layer 210. The high voltage well 220 may be formed by one or more ion implantation processes known in the art, in which a plurality of dopant ions are implanted to a region of the substrate 200 above the buried layer 210. The high voltage well 220 is doped with the same type dopant as the buried layer 210 and has the same doping polarity as the buried layer 210. Thus, in the illustrated embodiment, the high voltage well 220 is an n-type high voltage well, which may also be referred to as a high voltage n-well (HVNW). In some embodiments, the high voltage well 220 has a doping concentration level that is in a range from about $1.0 \times 10^{15}$ ions/cm$^3$ to about $1.0 \times 10^{18}$ ions/cm$^3$. It is understood, however, that the values recited herein are merely examples and may be changed in different embodiments.

The ESD protection device 120A includes high voltage wells 230 and 231 that are formed over the buried layer 210. The high voltage wells 230-231 are formed on opposite sides of the high voltage well 220. The high voltage wells 230-231 may be formed by one or more ion implantation processes known in the art, in which a plurality of dopant ions are implanted to a region of the substrate 200 above the buried layer 210. The high voltage wells 230-231 are doped with a different type dopant as the buried layer 210 (or the high voltage well 220) and has a doping polarity opposite than that of as the buried layer 210 (or the high voltage well 220). Thus, in the illustrated embodiment, the high voltage wells 230-231 are p-type high voltage wells, which may also be referred to as a high voltage p-well (HVPW). In some embodiments, the high voltage wells 230-231 have doping concentration levels that are in a range from about $1.0 \times 10^{15}$ ions/cm$^3$ to about $1.0 \times 10^{18}$ ions/cm$^3$.

The ESD protection device 120A includes a doped region 240 that is formed over the HVNW 220. The doped region 240 may be formed by one or more ion implantation processes known in the art. The doped region 240 is doped with the same type dopant as the HVNW 220. Thus, in the illustrated embodiment, the doped region 240 is an n-type region. The doped region 240 has a doping concentration level that is significantly greater than that of the HVNW 220, for example, about 5-100 times greater. In some embodiments, the doped region 240 has a doping concentration level that is in a range from about $5.0 \times 10^{15}$ ions/cm$^3$ to about $1.0 \times 10^{20}$ ions/cm$^3$. It is understood, however, that the values recited herein are merely examples and may be changed in different embodiments.

The ESD protection device 120A includes doped regions 250-251 that are formed over the HVPWs 230-231, respectively. The doped regions 250-251 may be formed by one or more ion implantation processes known in the art. The doped regions 250-251 are doped with the same type dopant as the HVPWs 230-231 (or opposite from the HVNW 220). Thus, in the illustrated embodiment, the doped regions 250-251 are p-type regions. The doped regions 250-251 have a doping concentration level that is significantly greater than that of the HVPWs 230-231 (or that of the HVNW 220), for example, about 5-100 times greater. In some embodiments, the doped regions 250-251 have a doping concentration level that is in a range from about $5.0 \times 10^{15}$ ions/cm$^3$ to about $1.0 \times 10^{20}$ ions/cm$^3$. It is understood, however, that the values recited herein are merely examples and may be changed in different embodiments.

Although FIG. 2 shows only one HVNW 220 and two HVPWs 230-231, it is understood that the ESD protection device 120A may include additional HVNWs or HVPWs that are not illustrated herein. For example, the ESD protection device 120A may include an additional HVNW that is adjacent to the HVPW 230 or adjacent to the HVPW 231. In other words, the HVNWs and HVPWs may be configured in an alternating or interdigitated manner. The same may be said for the doped regions 240 and 250-251.

The ESD protection device 120A also includes heavily doped regions 260 and 270-271 that are formed over the doped regions 240 and 250-251, respectively. The heavily doped regions 260 and 270-271 may be formed by one or more ion implantation processes known in the art. The heavily doped regions 260 and 270-271 are doped with the same type dopant as the HVPWs 230-231 (or opposite from the HVNW 220). Thus, in the illustrated embodiment, the heavily doped regions 260 and 270-271 are p-type regions. The heavily doped regions 260 and 270-271 have a doping concentration level that is greater than that of the doped regions 240 and 250-251. In some embodiments, the heavily doped regions 260 and 270-271 have a doping concentration level that is in a range from about $1 \times 10^{20}$ ions/cm$^3$ to about $1 \times 10^{23}$ ions/cm$^3$. It is understood, however, that the values recited herein are merely examples and may be changed in different embodiments. The heavily doped region 260 forms a p-n junction with the doped region 240 therebelow.

It is also understood that the various wells and regions may have their doping polarities switched in other embodiments. In other words, a p-type region may be formed as an n-type region, and conversely an n-type region may be formed as a p-type region. As an example, a HVPW will become a HVNW, and a HVNW will become a HVPW in those other embodiments.

The heavily doped region 260 may be considered an emitter component of a BJT device. The doped well 230 and the doped regions 250 and 270 may be collectively considered a collector component of the BJT device. Similarly, the doped well 231 and the doped regions 251 and 271 may be collectively viewed as another collector component of a different BJT device. The collector components may "share" the emitter component in some embodiments.

The doped well 220 and the doped region 240 are portions of a base component of the BJT device. The base component further includes a heavily doped region having an opposite doping polarity from the regions 260 and 270-271. Thus, in the embodiment shown in FIG. 2, the base component includes an n-type heavily doped region (not illustrated in FIG. 2). The BJT device illustrated in FIG. 2 is a p-n-p type BJT device, since its collector and emitter components are p-type devices, and the base component is an n-type device. In alternative embodiments, n-p-n type BJT devices may be formed by switching the doping polarities of the various elements discussed above. It is understood that the various elements of the BJT device may be formed using CMOS-compatible fabrication processes.

The ESD protection device 120A further includes isolation structures 280-282 that separate the doped regions 240 and 250-251 as well as the heavily doped regions 260 and 270-271 from one another. In some embodiments, the isolation structures 280-282 each include a shallow trench isolation (STI) device, which may be formed by etching a recess in the substrate 200 and thereafter filling the recess with a dielectric material. The dielectric material may contain silicon oxide, silicon nitride, silicon oxynitride, fluoride-doped silicate (FSG), and/or a low-k dielectric material known in the art. In other embodiments, the isolation structures 280-282 may include different types of isolation devices, such as deep trench isolation (DTI) devices or other suitable devices. It is understood that the isolation structures 280-282 may include any type of isolation structure formed any method currently known in the art or developed later.

It is understood that the order in which the various elements of the ESD protection device 120A is described above does not imply an order in which they are fabricated. For example, the doped region 250 need not be formed after the doped region 240 is formed. Or as another example, the isolation structures 280-282 may be formed before the doped regions 240 and 250-251 are formed. In any case, the specific order in which these elements are formed may be adjusted or changed to suit design requirements and manufacturing concerns.

An interface 290 is formed at the p/n junction between the doped region 220 and the doped region 230, and an interface 291 is formed at the p/n junction between the doped region 220 and the doped region 231. Each of the interfaces 290-291 may also be considered the p/n junction interfaces between the base component and the collector components of the associated BJT device. The doped region 240 is spaced apart from the interfaces 290 and 291 by distances 300 and 301, respectively. In the embodiments discussed herein, the distances 300 and 301 may be substantially the same. In other embodiments, the distances 300-301 may be different from each other. The doped region 250 is spaced apart from the interfaces 290 by a distance 310, and the doped region 251 is spaced apart from the interface 291 by a distance 311. In the embodiments discussed herein, the distances 310 and 311 may be substantially the same. In other embodiments, the distances 310-311 may be different from each other. Furthermore, in some embodiments, the distances 300-301 and 310-311 may all be substantially equal to one another.

The length of the distances 300-301 and 310-311 may be adjusted by relevant lithography parameters, for example, the sizes of implantation masks used to form the doped regions 220, 230-231, 240, and 250-251. In some embodiments, the distances 300-301 and 310-311 are in a range from about zero to about seven microns.

The distances 300-301 and 310-311 may each be adjusted independently to achieve a desired value for a turn-on voltage (also referred to as a threshold voltage) for the associated BJT device, a desired value for a breakdown voltage of the BJT device, as well as a desired value for a holding voltage for the BJT device. These voltages will be discussed in more detail with reference to FIG. 18 later. In some embodiments, the distances 300-301 (or the distances 310-311) may be tuned such that the associated BJT device will be self-triggered by the current that is generated by lateral avalanche breakdown. In that case, the values for the turn-on voltage, the breakdown voltage, and the holding voltage are substantially equal to one another. In other words, the turn-on voltage is approximately equal to the breakdown voltage, which is approximately equal to the holding voltage. In some embodiments, the turn-on voltage, the breakdown voltage, and the holding voltage are within a few milli-volts or a few tens of milli-volts of one another. Thus, the embodiments disclosed herein allows for altering device characteristics through the tuning of layout parameters.

Figure 3:
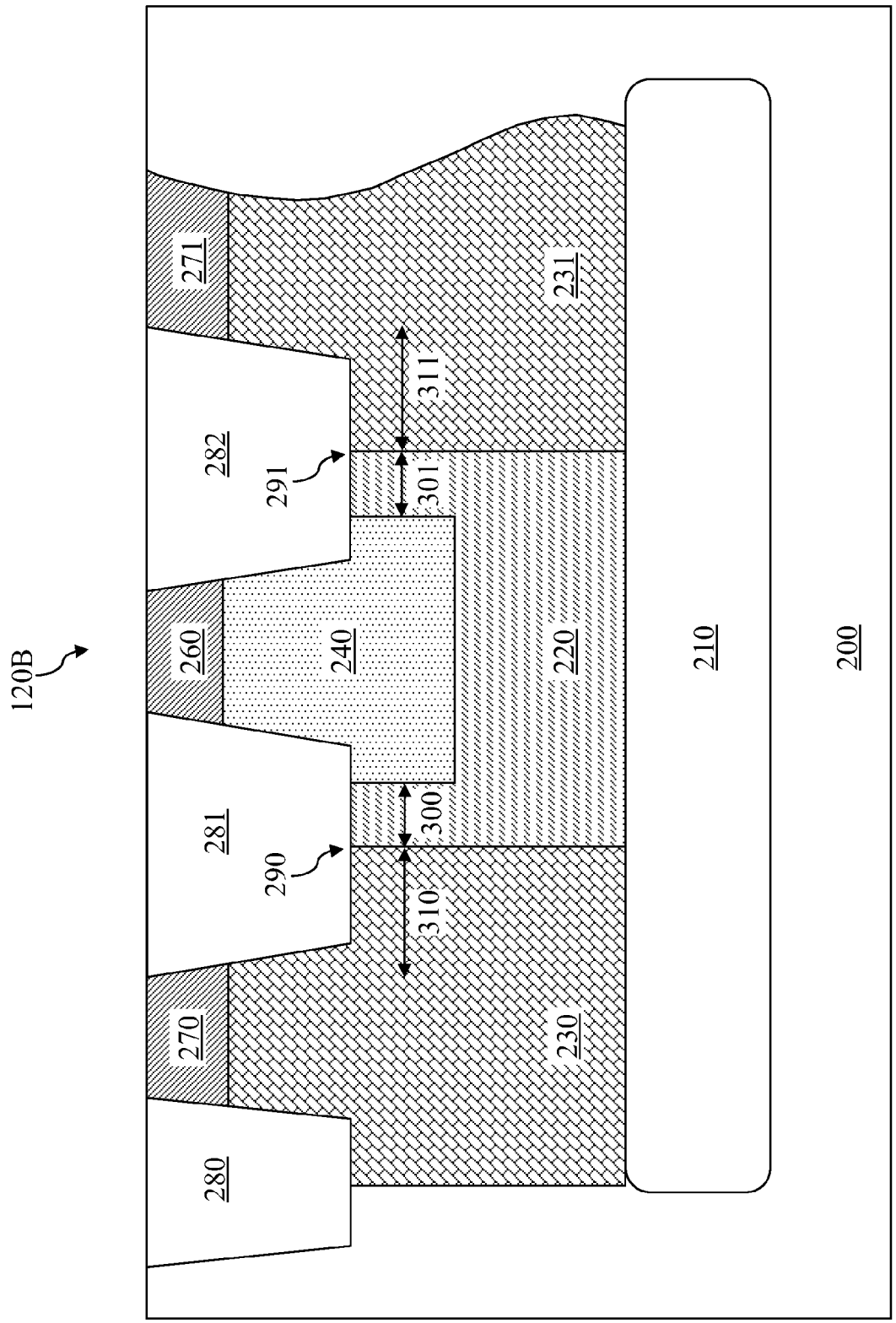

FIG. 3 is a diagrammatic fragmentary cross-sectional side view of an alternative embodiment of an ESD protection device 120B. The ESD protection device 120B is similar to the ESD protection device 120A in many aspects. For example, the ESD protection device 120B includes a buried layer 210, doped wells 220 and 230-231, a doped region 240, heavily doped regions 260 and 270-271, and isolation structures 280-282. But unlike the ESD protection device 120A, the ESD protection device 120B does not have the doped regions 250-251. Thus, while the emitter and base components remain substantially the same for the ESD protection device 120B, each collector component now includes the well 230 and the heavily doped region 270 (or the well 231 and the heavily doped region 271) but not the doped regions 250-251.

The interfaces 290-291 between the base component and the collector components may remain substantially unchanged for the ESD protection device 290B, and therefore the distances 300-301 may remain the same. However, the distances 310-311 are now measured from the interfaces 290-291 into a region somewhere inside the doped wells 230-231, respectively. In other words, the distances 310-311 may be greater than the distances 300-301. The shorter distances 300-301 are more dominant factors (compared to the longer distances 310-311) for the values for the associated BJT device's turn-on voltage, breakdown voltage, and holding voltage. Thus, the desired values for the turn-on voltage, the breakdown voltage, and the holding voltage may be chosen mostly based on the length of the distances 300 or 301.

Figure 4:
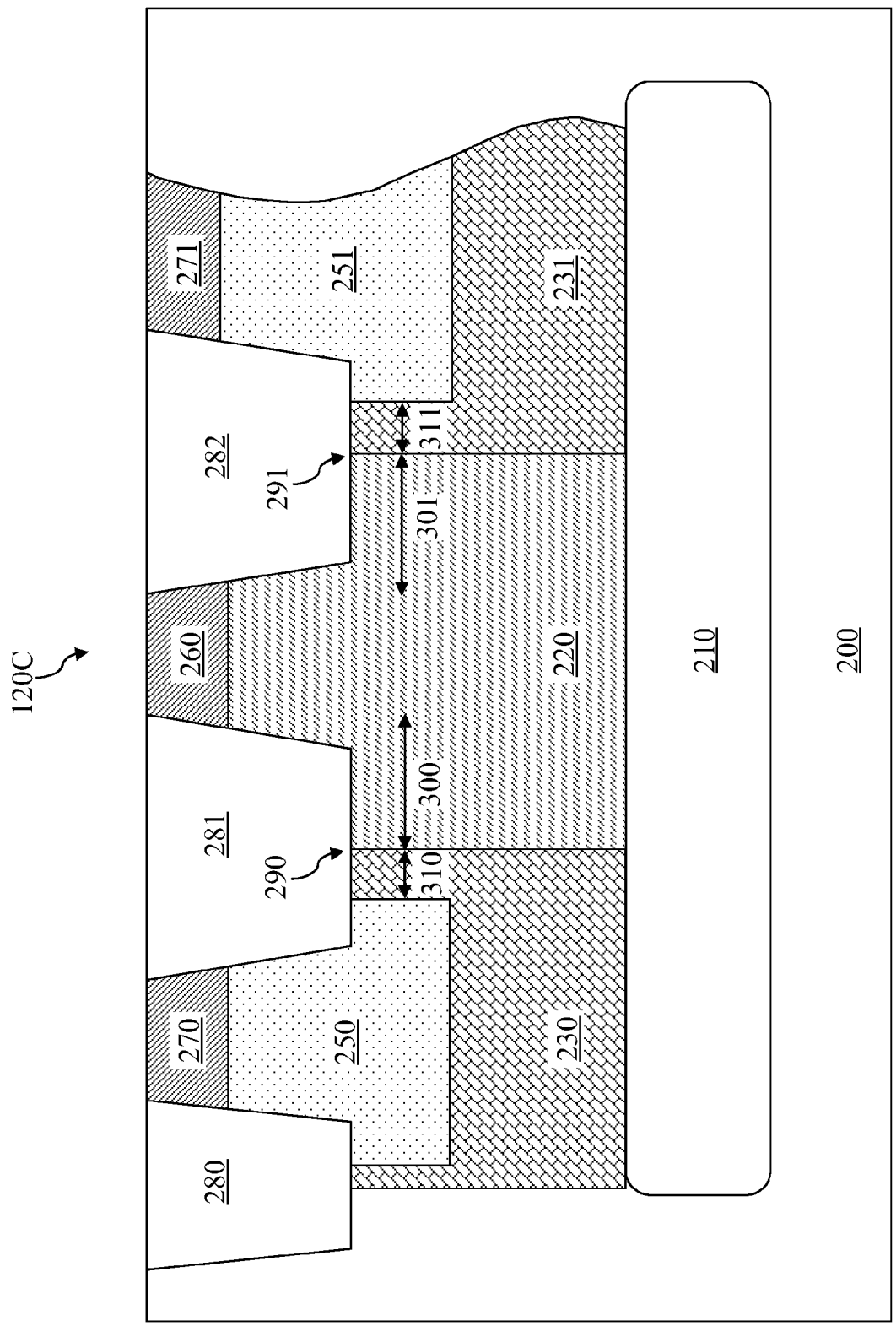

FIG. 4 is a diagrammatic fragmentary cross-sectional side view of an alternative embodiment of an ESD protection device 120C. The ESD protection device 120C is similar to the ESD protection device 120A in many aspects. For example, the ESD protection device 120C includes a buried layer 210, doped wells 220 and 230-231, doped regions 250-251, heavily doped regions 260 and 270-271, and isolation structures 280-282. But unlike the ESD protection device 120A, the ESD protection device 120C does not have the doped region 240. Thus, while the collector and emitter components remain substantially the same for the ESD protection device 120C, the base component now includes the well 220 but not the doped region 240.

The interfaces 290-291 between the base component and the collector components may remain substantially the same for the ESD protection device 290C, and therefore the distances 310-311 may remain the same. However, the distances 300-301 are now measured from the interfaces 290-291 into a region somewhere inside the doped well 220. In other words, the distances 300-301 may be greater than the distances 310-311. The shorter distances 310-311 are more dominant factors (compared to the longer distances 300-301) for the values for the associated BJT device's turn-on voltage, breakdown voltage, and holding voltage. Thus, the desired values for the turn-on voltage, the breakdown voltage, and the holding voltage may be chosen mostly based on the length of the distances 310 or 311.

Figure 5:
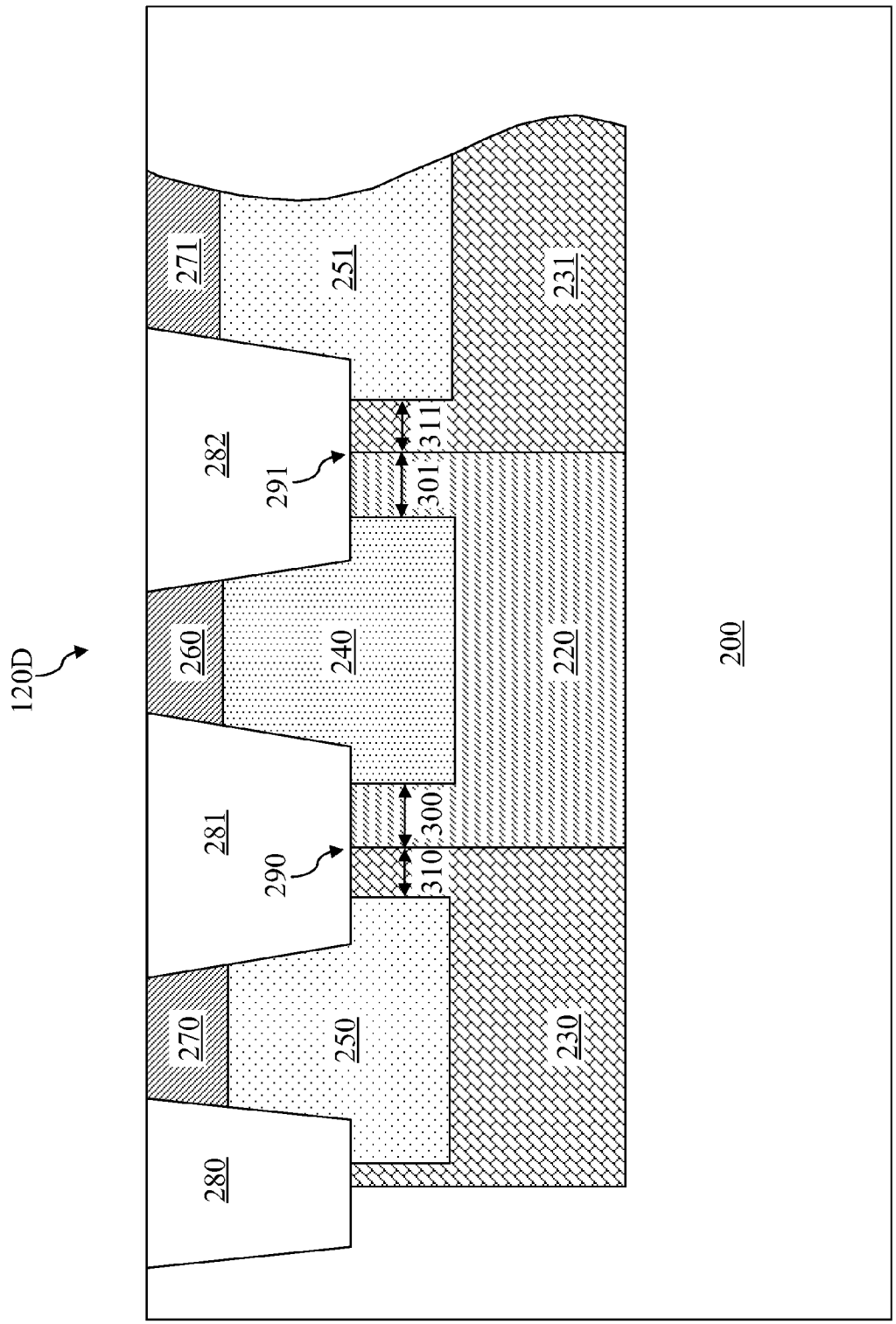

FIG. 5 is a diagrammatic fragmentary cross-sectional side view of an alternative embodiment of an ESD protection device 120D. The ESD protection device 120D is similar to the ESD protection device 120A in many aspects. For example, the ESD protection device 120D includes doped wells 220 and 230-231, doped regions 240 and 250-251, heavily doped regions 260 and 270-271, and isolation structures 280-282. But unlike the ESD protection device 120A, the ESD protection device 120D does not have the buried layer 210. The base, emitter and collector components of the ESD protection device 120D may remain substantially the same as those of the ESD protection device 120A, respectively.

Figure 6:
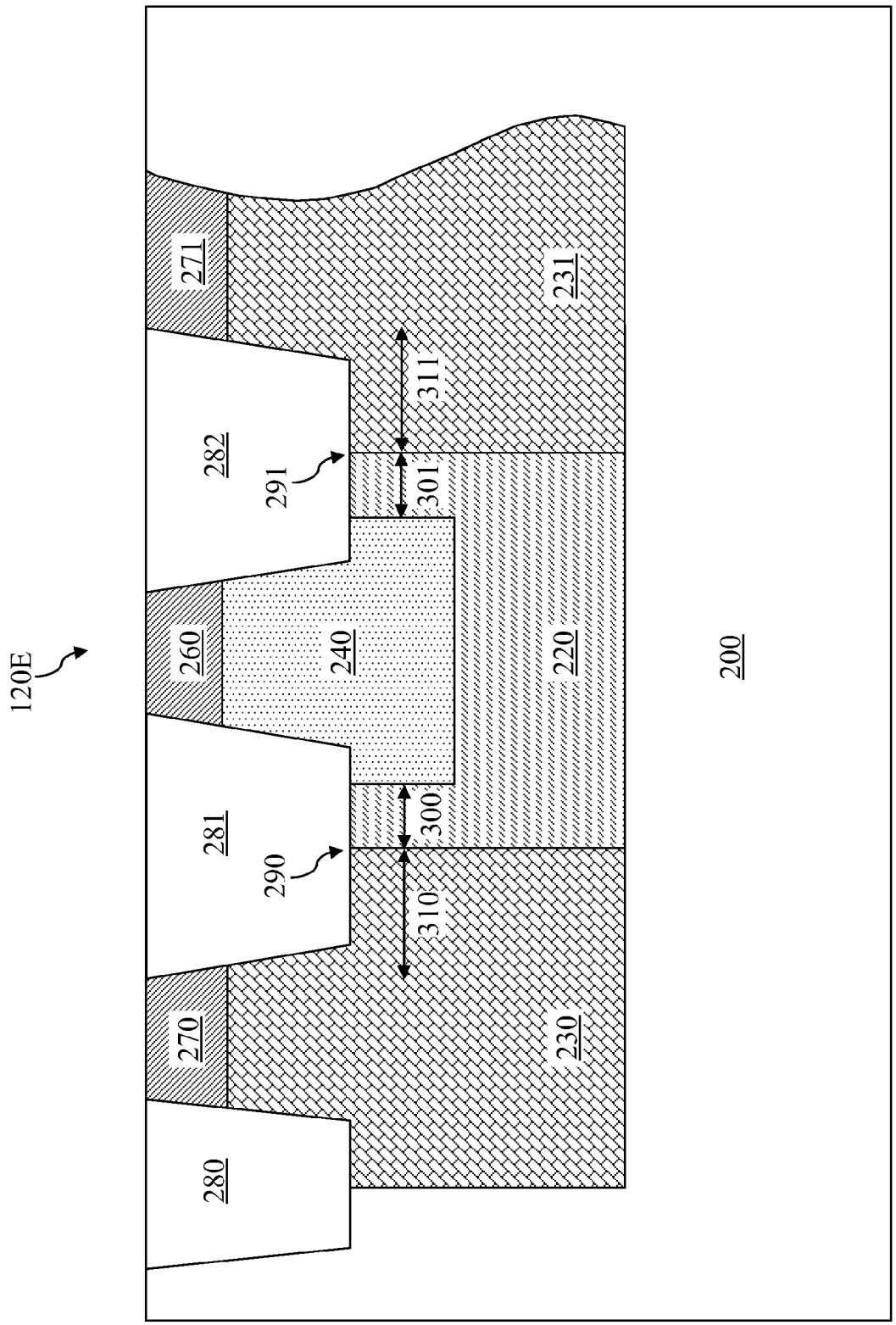

FIG. 6 is a diagrammatic fragmentary cross-sectional side view of an alternative embodiment of an ESD protection device 120E. The ESD protection device 120E is similar to the ESD protection device 120B in many aspects. For example, the ESD protection device 120E includes doped wells 220 and 230-231, a doped region 240, heavily doped regions 260 and 270-271, and isolation structures 280-282. But unlike the ESD protection device 120B, the ESD protection device 120E does not have the buried layer 210. The base, emitter and collector components of the ESD protection device 120E may remain substantially the same as those of the ESD protection device 120B, respectively.

Figure 7:
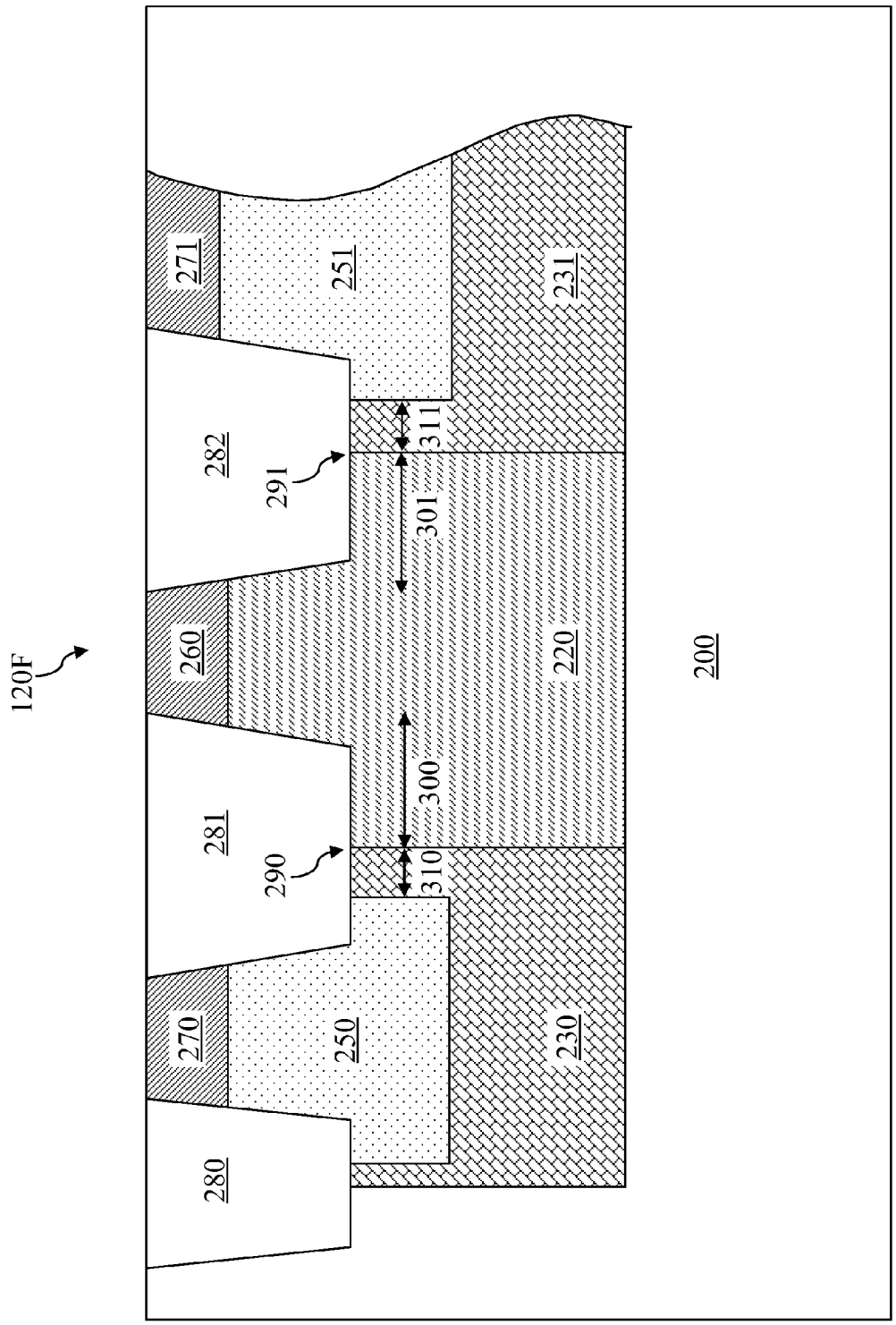

FIG. 7 is a diagrammatic fragmentary cross-sectional side view of an alternative embodiment of an ESD protection device 120F. The ESD protection device 120F is similar to the ESD protection device 120C in many aspects. For example, the ESD protection device 120F includes doped wells 220 and 230-231, doped regions 250-251, heavily doped regions 260 and 270-271, and isolation structures 280-282. But unlike the ESD protection device 120C, the ESD protection device 120F does not have the buried layer 210. The base, emitter and collector components of the ESD protection device 120F may remain substantially the same as those of the ESD protection device 120C, respectively.

Figure 8:
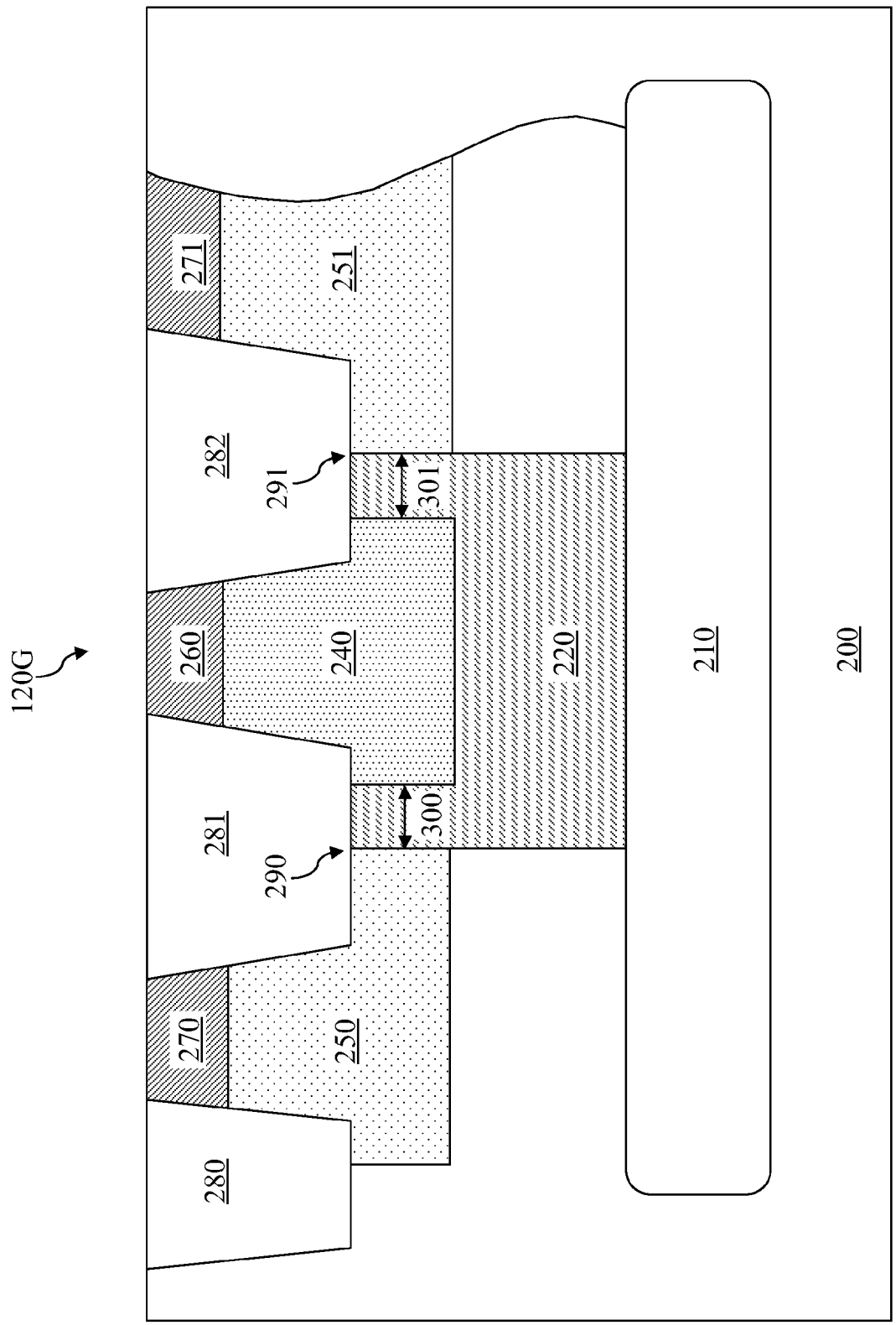

FIG. 8 is a diagrammatic fragmentary cross-sectional side view of an alternative embodiment of an ESD protection device 120G. The ESD protection device 120G is similar to the ESD protection device 120A in many aspects. For example, the ESD protection device 120G includes a buried layer 210, a doped well 220, doped regions 240 and 250-251, heavily doped regions 260 and 270-271, and isolation structures 280-282. But unlike the ESD protection device 120A, the ESD protection device 120G does not have the doped wells 230-231. The base component of the ESD protection device 120G includes the doped well 220 and the doped region 240. The emitter component of the ESD protection device 120G includes the heavily doped region 260. The collector component of the ESD protection device 120G includes the doped regions 250 and 270 (or the doped regions 251 and 271).

Figure 9:
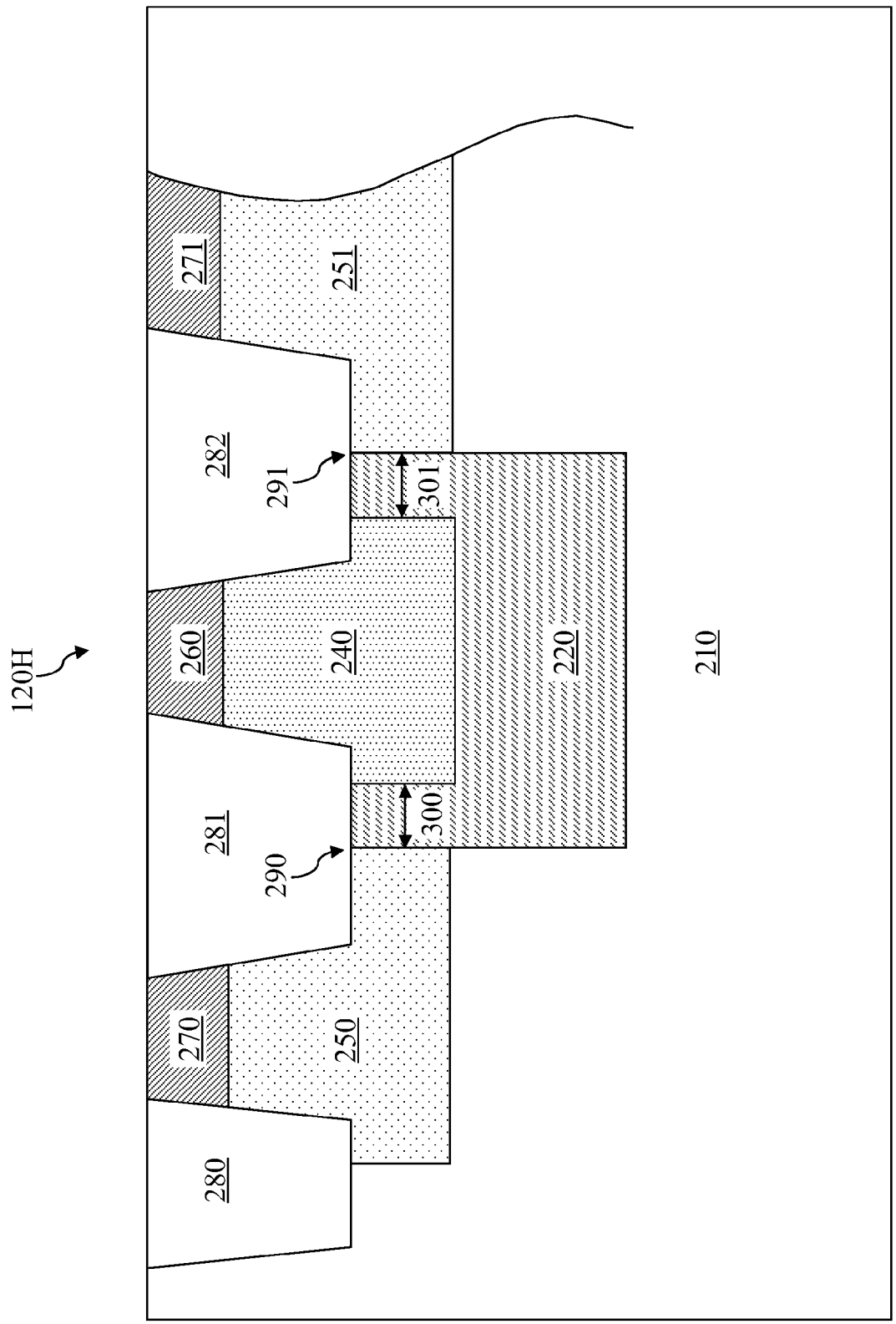

FIG. 9 is a diagrammatic fragmentary cross-sectional side view of an alternative embodiment of an ESD protection device 120H. The ESD protection device 120H is similar to the ESD protection device 120G in many aspects. For example, the ESD protection device 120H includes a doped well 220, doped regions 240 and 250-251, heavily doped regions 260 and 270-271, and isolation structures 280-282. But unlike the ESD protection device 120G, the ESD protection device 120H does not have the buried layer 210. The base component of the ESD protection device 120G includes the doped well 220 and the doped region 240. The emitter component of the ESD protection device 120G includes the heavily doped region 260. The collector component of the ESD protection device 120G includes the doped regions 250 and 270 (or the doped regions 251 and 271).

Figure 10:
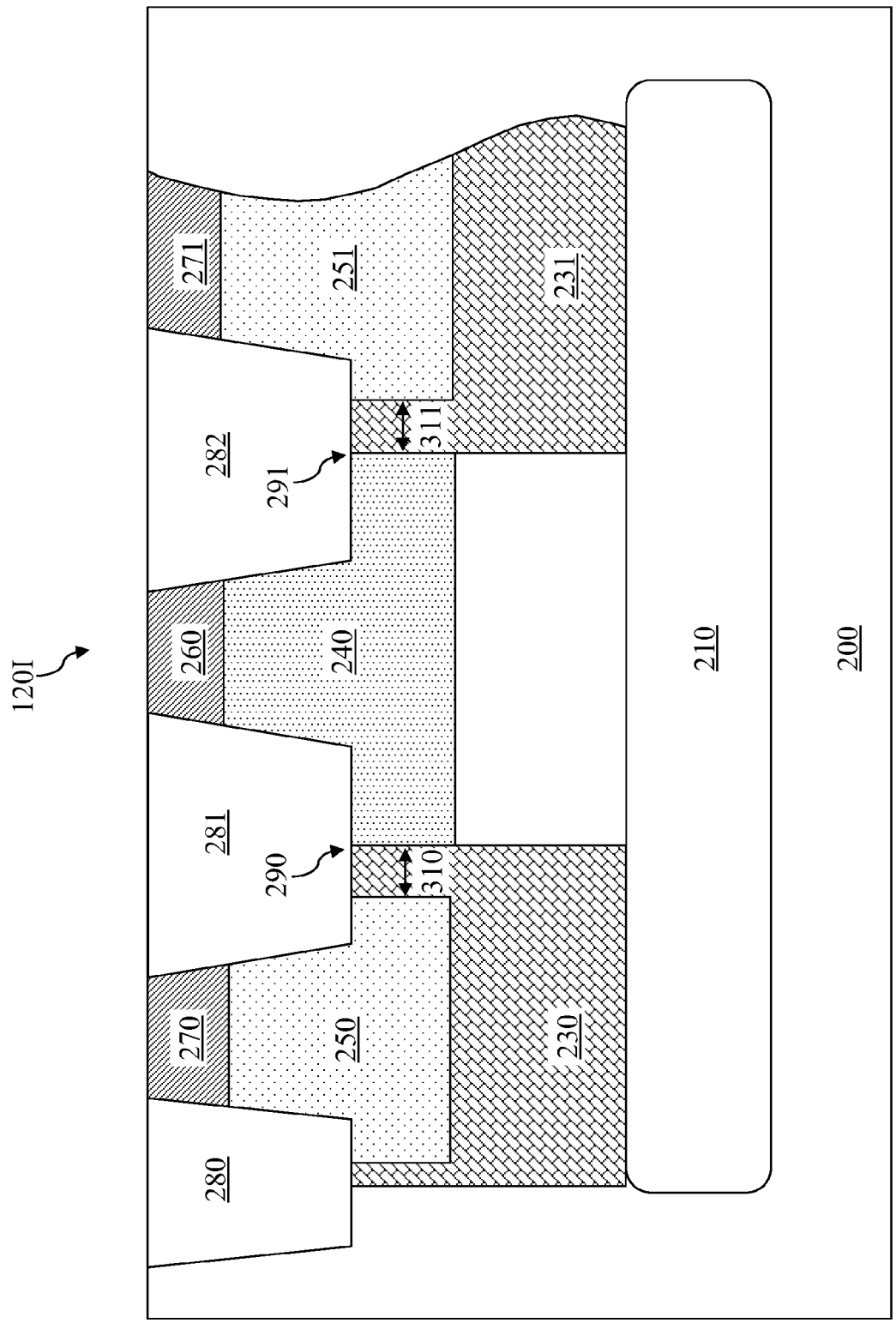

FIG. 10 is a diagrammatic fragmentary cross-sectional side view of an alternative embodiment of an ESD protection device 120I. The ESD protection device 120I is similar to the ESD protection device 120A in many aspects. For example, the ESD protection device 120I includes a buried layer 210, doped wells 230-231, doped regions 240 and 250-251, heavily doped regions 260 and 270-271, and isolation structures 280-282. But unlike the ESD protection device 120A, the ESD protection device 120I does not have the doped well 220. The base component of the ESD protection device 120I includes the doped region 240. The emitter component of the ESD protection device 120I includes the heavily doped region 260. The collector component of the ESD protection device 120I includes the doped well 230 and the doped regions 250 and 270 (or the doped well 231 and the doped regions 251 and 271).

Figure 11:
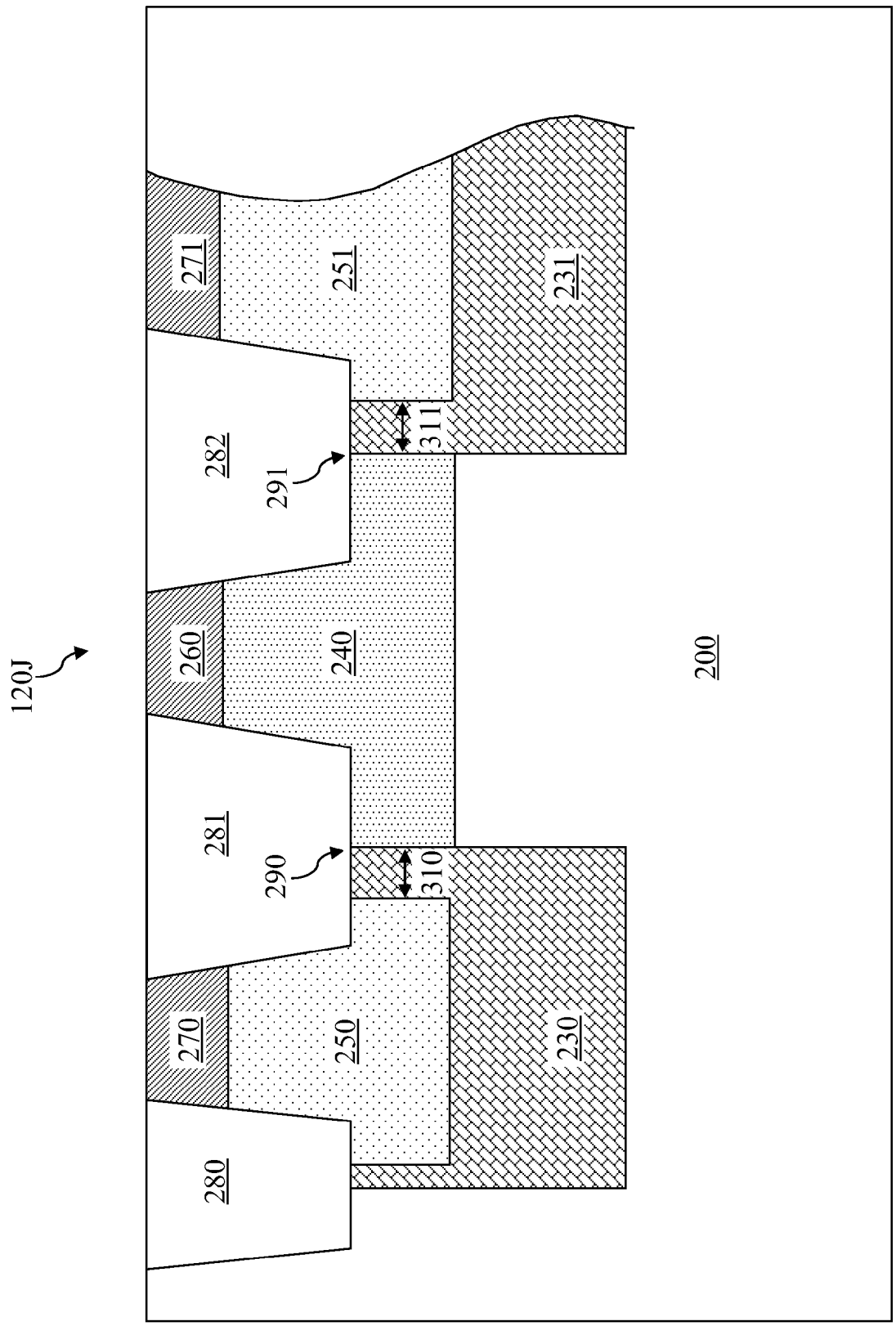

FIG. 11 is a diagrammatic fragmentary cross-sectional side view of an alternative embodiment of an ESD protection device 120J. The ESD protection device 120J is similar to the ESD protection device 120D in many aspects. For example, the ESD protection device 120J includes doped wells 230-231, doped regions 240 and 250-251, heavily doped regions 260 and 270-271, and isolation structures 280-282. But unlike the ESD protection device 120D, the ESD protection device 120J does not have the doped well 220. The base component of the ESD protection device 120J includes the doped region 240. The emitter component of the ESD protection device 120I includes the heavily doped region 260. The collector component of the ESD protection device 120J includes the doped well 230 and the doped regions 250 and 270 (or the doped well 231 and the doped regions 251 and 271). The doped region 240 is formed over portions of the substrate 200 instead of being formed over the doped well 220.

It is understood that the various embodiments of the ESD protection device 120 illustrated in FIGS. 2-11 are provided merely as examples and are not intended to be limiting. Depending on design requirements and manufacturing concerns, the ESD protection device may have different configurations consistent with the spirit of the present disclosure in alternative embodiments.

Figure 12:
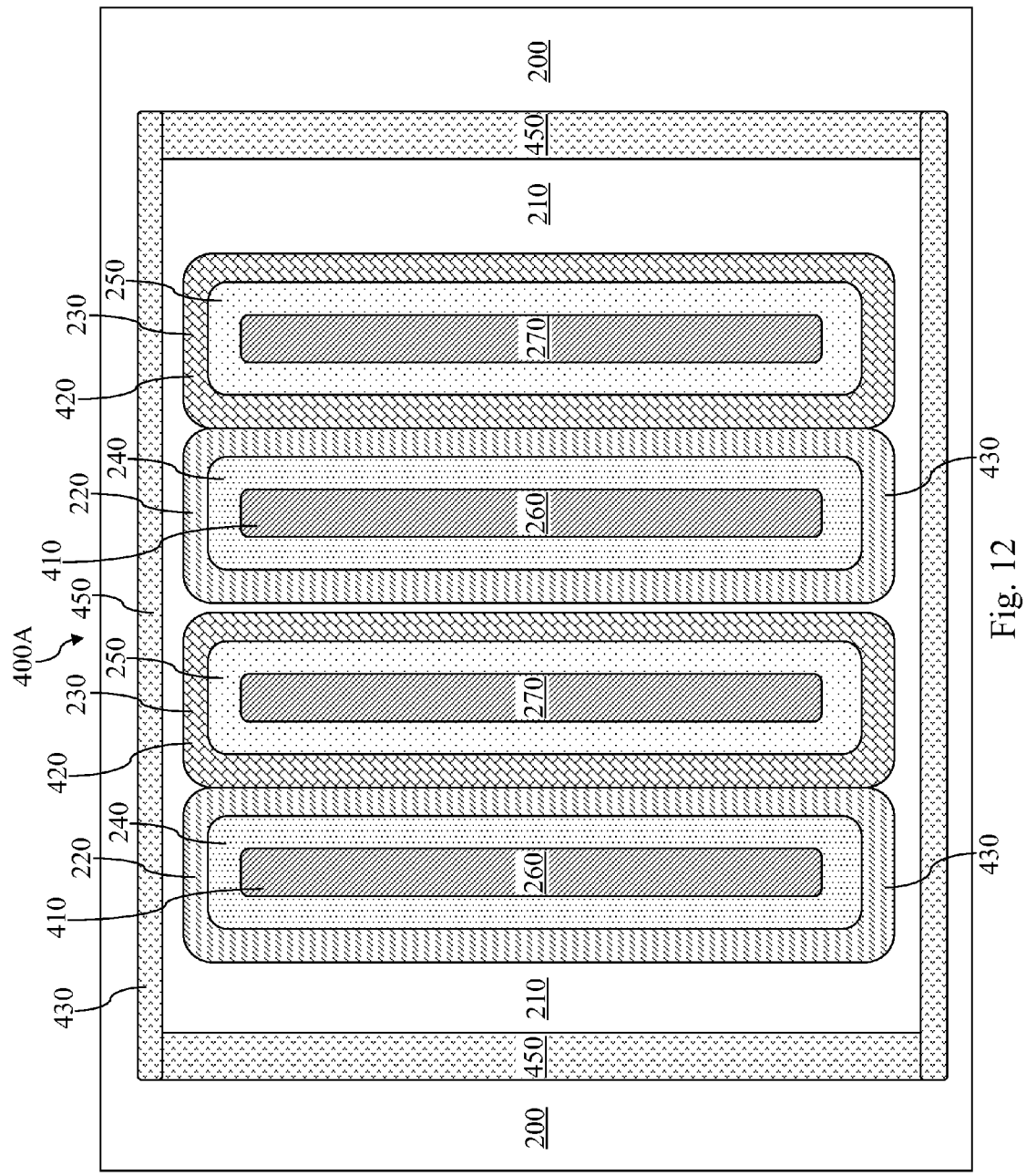
FIGS. 12-17 are simplified top views of different embodiments of a semiconductor device according to various aspects of the present disclosure.

FIG. 12 is a diagrammatic fragmentary top view of a portion of an ESD protection device 400A according to an embodiment of the present disclosure. The ESD protection device 400A is substantially similar to the ESD protection device 120 and may be implemented according to any of the embodiments of the ESD protection device 120 shown in the cross-sectional views of FIGS. 2-11. For the sake of providing an example, the ESD protection device 400A shown in FIG. 12 is implemented with the ESD protection device 120A shown in FIG. 2. For reasons of clarity and consistency, similar components of the ESD protection device 120A and 400A will be labeled the same in both FIGS. 2 and 12.

The ESD protection device 400A includes emitter components 410 and collector components 420 and a base component 430 formed over the substrate 200. As discussed above with reference to FIG. 2, the emitter components 410 and the collector components 420 are interdigitated or disposed in an alternating fashion. Each emitter component 410 includes the heavily doped region 260. The base component 430 includes the doped well 220, the doped region 240, and a heavily doped region 450. The heavily doped region 260 a higher doping concentration level than the doped well 220 and the doped region 240, and the doped region 240 has a higher doping concentration level than the doped well 220. As FIG. 12 illustrates, the heavily doped region 260 (i.e., emitter component 410) is surrounded by the doped region 240 (part of the base component 430), which is surrounded by the doped well 220 (also part of the base component 430) in a top view.

Each collector component 420 includes the doped well 230, the doped region 250, and the heavily doped region 270. Among these elements of the collector component 420, the heavily doped region 270 has the highest doping concentration level, the doped well 230 has the lowest doping concentration level, and the doped region 250 has a doping concentration level in the middle (greater than the doped well 230 but less than the heavily doped region 270). As FIG. 12 illustrates, the heavily doped region 270 is surrounded by the doped region 250, which is surrounded by the doped well 230 in a top view.

The doped wells 220 and 230 have opposite doping polarities, and the doped regions 240 and 260 have opposite doping polarities. The doped well 220 and the doped region 240 have the same doping polarity, as do the doped well 230 and the doped region 250. The heavily doped regions 260 and 270 have the same doping polarity as the doped well 230 and the doped region 250, but the opposite doping polarity from the doped well 220 and the doped region 240. In the illustrated embodiment, the doped well 220 and the doped region 240 are of an n-type doping polarity, whereas the doped well 230, the doped region 250, and the heavily doped regions 260 and 270 are all of the p-type doping polarity.

The emitter components 410, the collector components 420, and portions of the base component 430 are formed over (and thus surrounded in a top view by) the buried layer 210. The buried layer 210 has the same doping polarity as the doped well 220 and the doped region 240. Thus, the buried layer 210 is of an n-type doping polarity in the embodiment shown in FIG. 12.

The heavily doped region 450 of the base component 430 has the same doping polarity but a higher doping concentration level than the doped well 220 and the doped region 240. In the top view of FIG. 12, the heavily doped region 450 is shaped as an approximately rectangular ring that surrounds the emitter components 410 and the collector components 420. Electrical connections between the base component 430 and external devices may be established through the ring-like heavily doped region 450. Thus, the embodiment shown in FIG. 12 may be referred to as an ESD protection device having a "ring type" base pickup.

Figure 13:
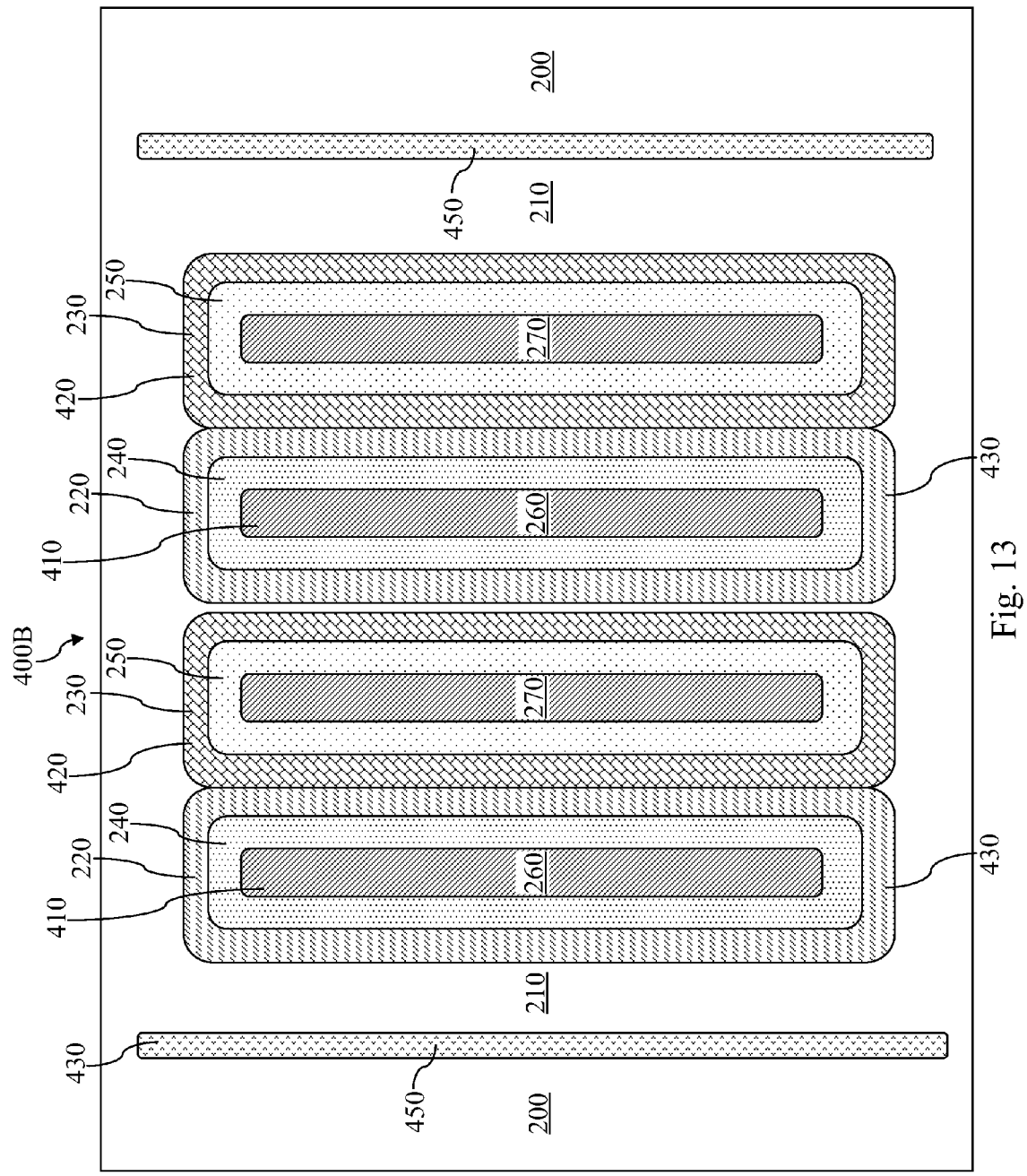

FIG. 13 is a diagrammatic fragmentary top view of a portion of an ESD protection device 400B according to another embodiment of the present disclosure. The ESD protection device 400B is similar to the ESD protection device 400A, except that the heavily doped regions 450 of the base component are shaped as "bands" located besides the emitter and collector components 410 and 420, rather than a "ring" around them. Electrical connections between the base component 430 and external devices may be established through the band-like heavily doped region 450. Thus, the embodiment shown in FIG. 13 may be referred to as an ESD protection device having a "band type" base pickup.

Figure 14:
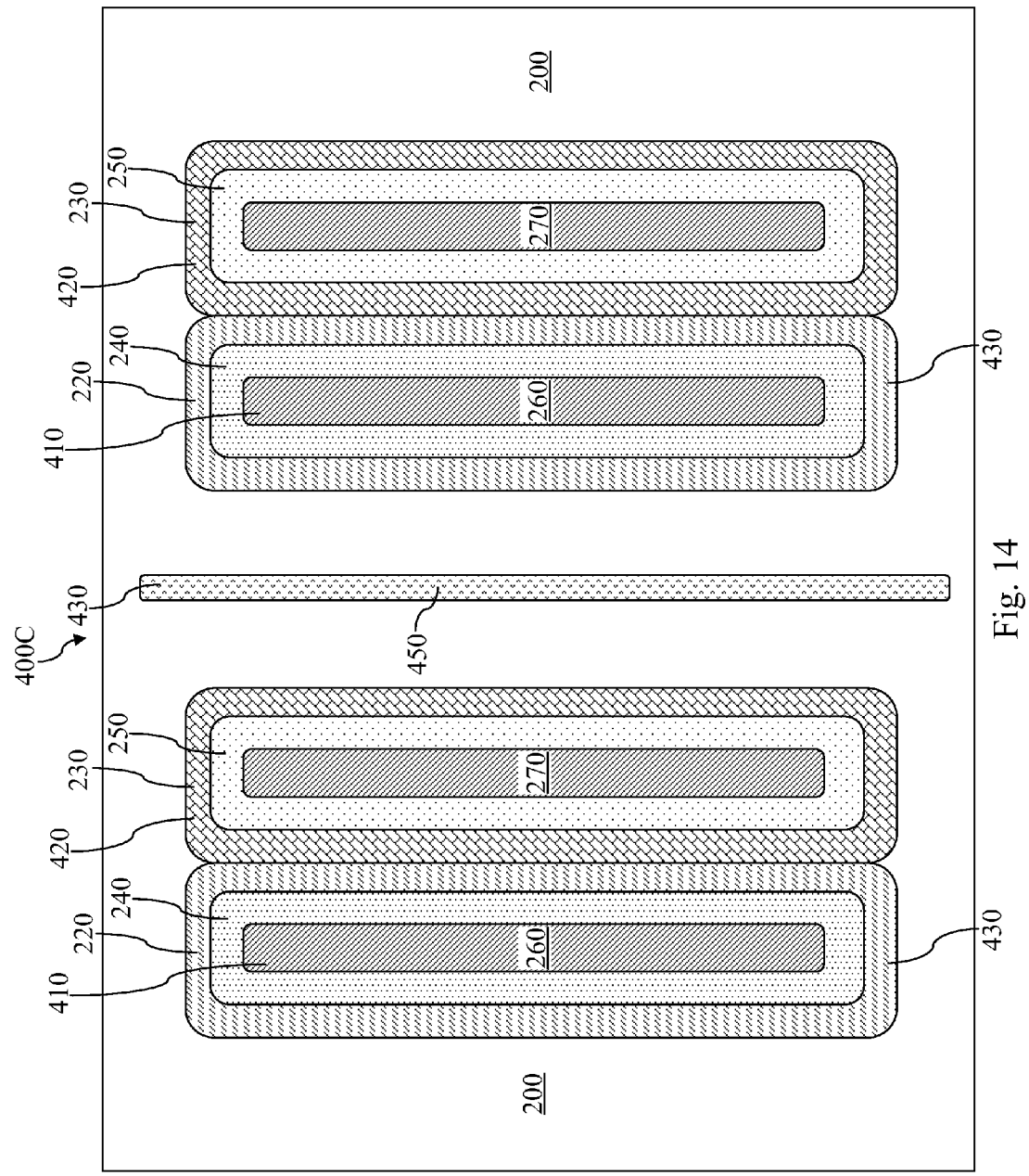

FIG. 14 is a diagrammatic fragmentary top view of a portion of an ESD protection device 400C according to another embodiment of the present disclosure. The ESD protection device 400C is similar to the ESD protection device 400B, except that the heavily doped region 450 of the base component forms a single "band" between the emitter and collector components 410 and 420. Electrical connections between the base component 430 and external devices may be established through the band-like heavily doped region 450. Thus, the embodiment shown in FIG. 14 may be referred to as an ESD protection device having an alternative "band type" base pickup.

Figure 15:
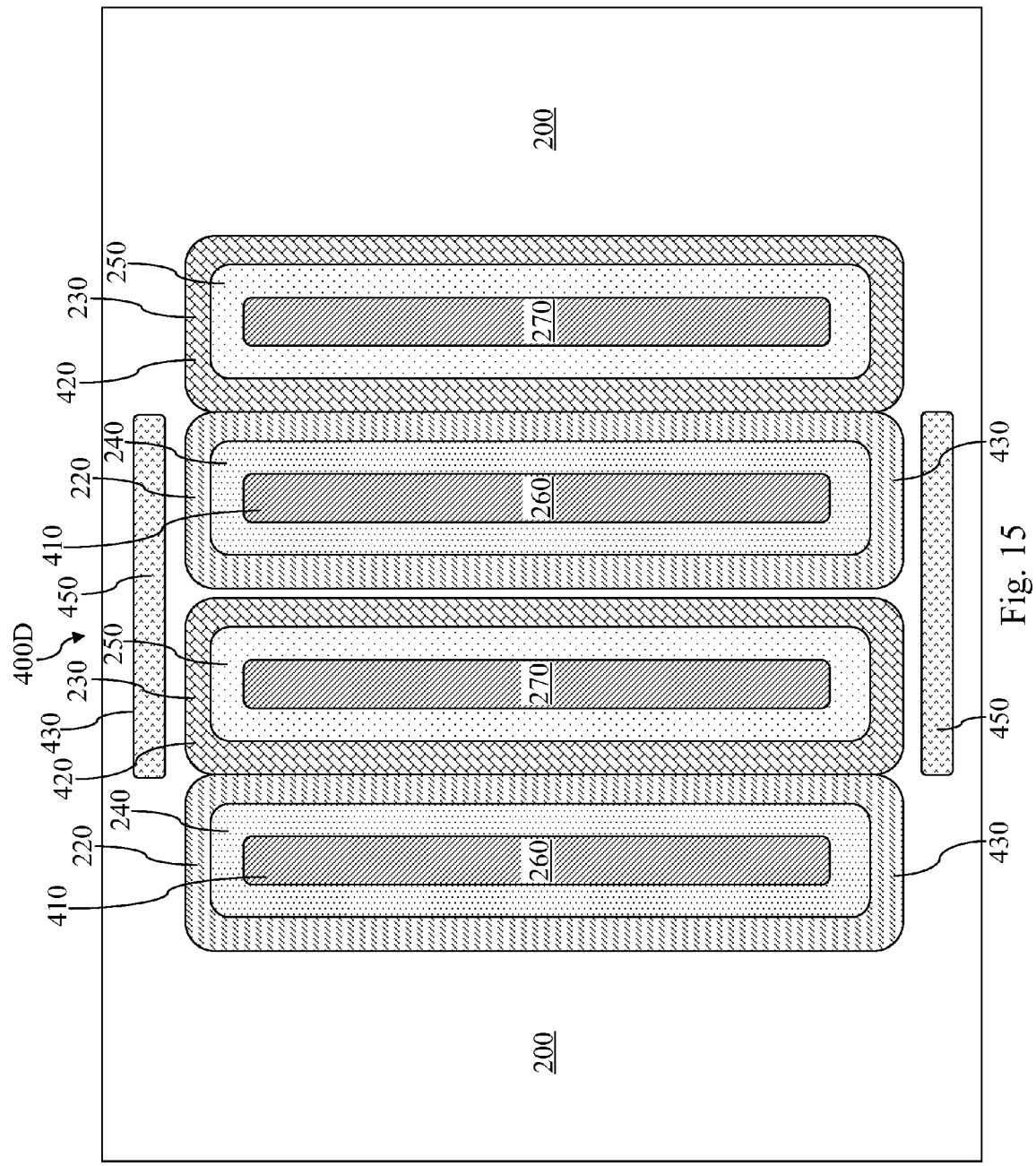

FIG. 15 is a diagrammatic fragmentary top view of a portion of an ESD protection device 400D according to yet another embodiment of the present disclosure. The ESD protection device 400C is similar to the ESD protection device 400B, except that the heavily doped regions 450 of the base component forms two "bands" on different sides of the emitter and collector components 410 and 420. The bands (i.e., the doped regions 450) in FIG. 15 are rotated 90 degrees compared to the bands in FIG. 13. Electrical connections between the base component 430 and external devices may be established through the ring-like heavily doped region 450. Thus, the embodiment shown in FIG. 15 may be referred to as an ESD protection device having yet another alternative "band type" base pickup.

Figure 16:
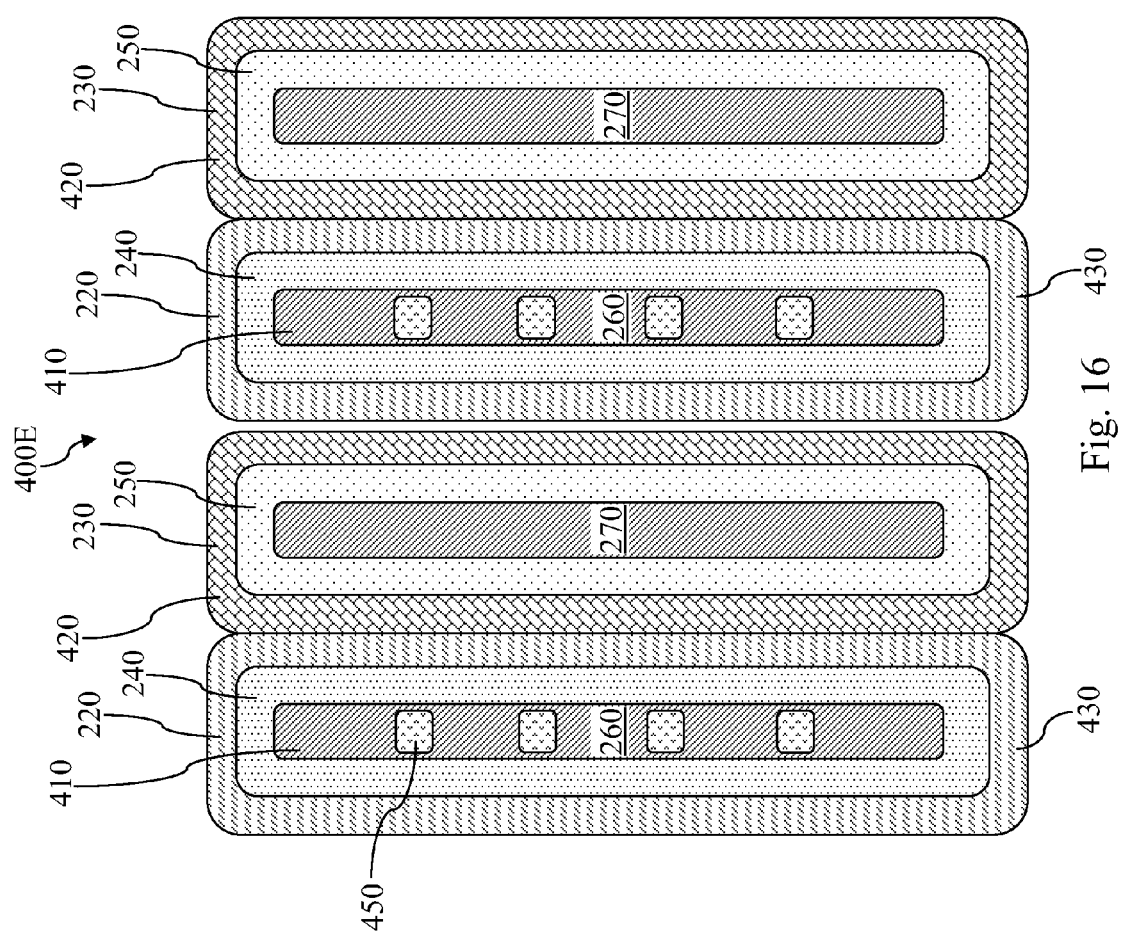

FIG. 16 is a diagrammatic fragmentary top view of a portion of an ESD protection device 400E according to another embodiment of the present disclosure. The ESD protection device 400E is similar to the ESD protection device 400A, except that the heavily doped regions 450 of the base component are shaped as "dots" (or small squares or rectangles) located within the heavily doped region 260 (i.e., the emitter component 410). Electrical connections between the base component 430 and external devices may be established through the dot-like heavily doped regions 450. Thus, the embodiment shown in FIG. 16 may be referred to as an ESD protection device having a "dot type" base pickup.

Figure 17:
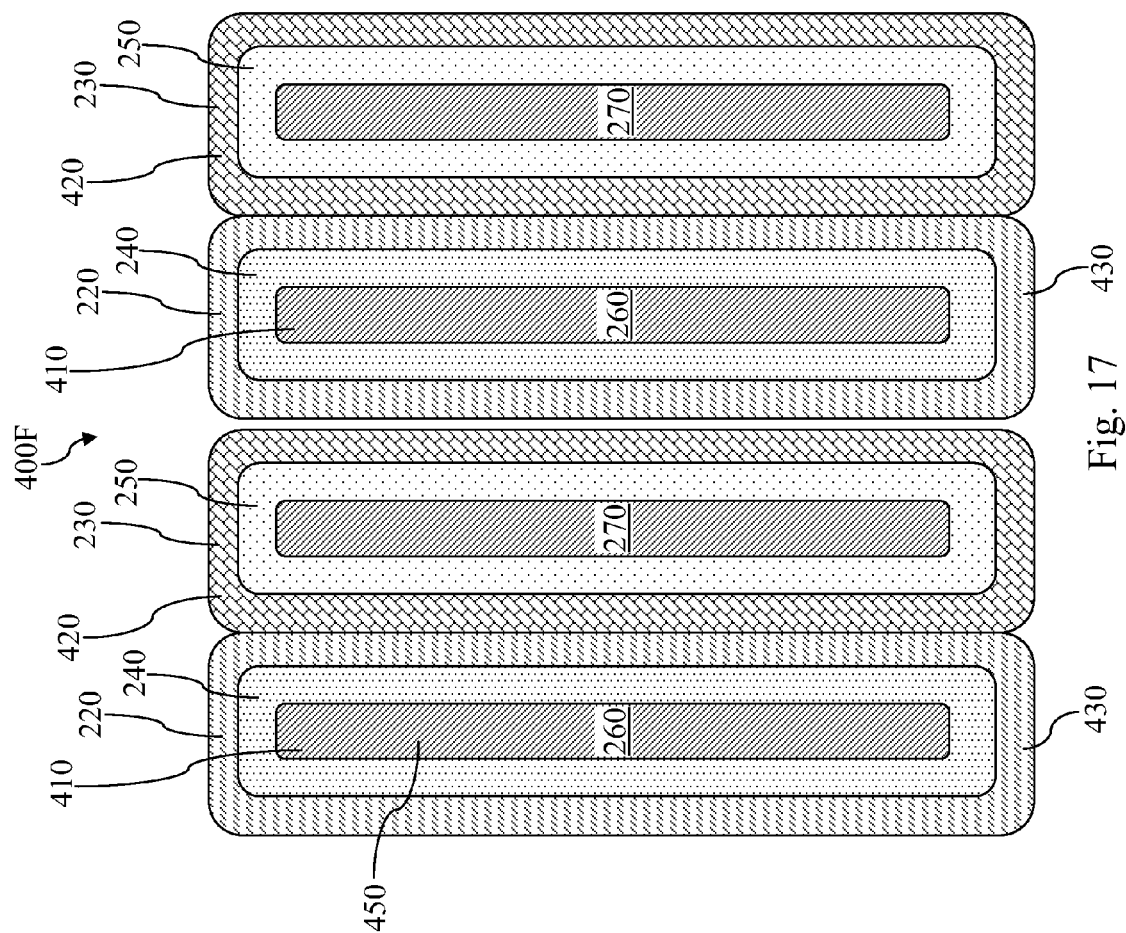

FIG. 17 is a diagrammatic fragmentary top view of a portion of an ESD protection device 400E according to another embodiment of the present disclosure. The ESD protection device 400E is similar to the ESD protection device 400A, except that there are no heavily doped regions 450. Therefore, the base component 430 is electrically floating in the embodiment shown in FIG. 17. Thus, the embodiment shown in FIG. 17 may be referred to as an ESD protection device having a "floating" base.

Figure 18:
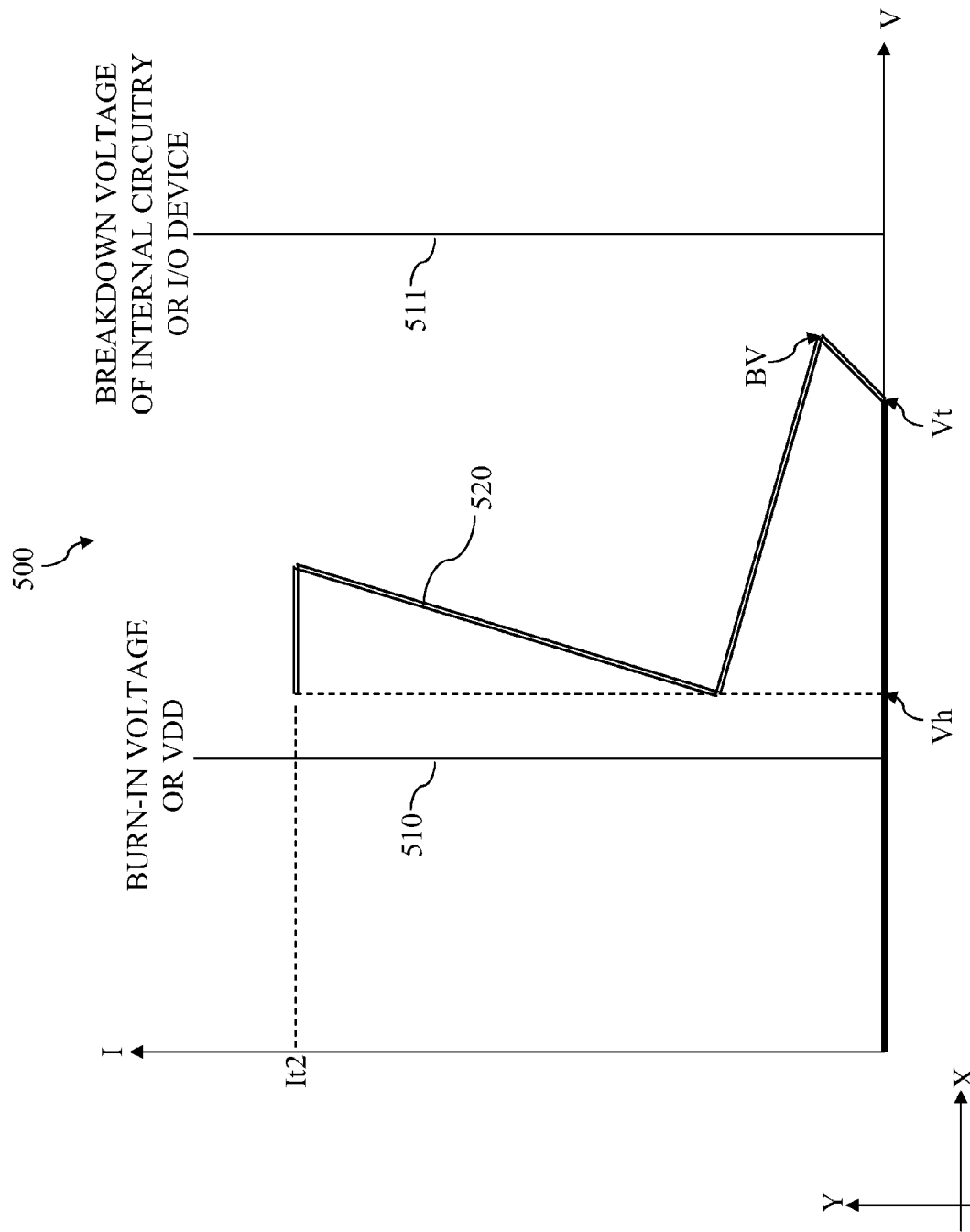
FIGS. 18-19 are graphs illustrating the I-V relationships of various types of ESD protection devices.

FIG. 18 is a graph 500 illustrating an I-V behavior of some conventional breakdown mode ESD protection devices. It is understood, however, that not all conventional breakdown mode ESD protection devices will exhibit the behavior illustrated in FIG. 18, and FIG. 18 is merely a simplified example of the behavior of some conventional breakdown mode ESD protection devices.

Referring to FIG. 18, the graph 500 contains an X-axis (representing voltage) and a Y-axis (representing current). Two vertical lines 510 and 511 represent a burn-in voltage and a breakdown voltage of internal IC circuitry, respectively. These two voltages may be considered specification limits that should not be exceeded. The I-V behavior of a conventional ESD protection device is graphed on the chart as a plot curve 520. The plot curve 520 contains the holding voltage Vh, the turn-on voltage Vt (also referred to as threshold voltage), and the breakdown voltage (for the ESD protection device) BV. As the graph 500 illustrates, the ESD protection device remains turned off until the turn-on voltage Vt is exceeded. Thus, as voltage increases, current increases as well. The ESD protection device enters a breakdown mode when the breakdown voltage BV is exceeded, and then, ESD device turn on At the holding voltage, the I-V curve as a positive slope again, thus as voltage increases, current increases rapidly again until it reaches the current limit at It2.

One problem of conventional ESD protection devices is the divergence between the voltages Vh, Vt, and BV. Since the difference in value between these voltages may be substantial, there is a chance that one of them may dip below the burn-in voltage or exceed the breakdown voltage of the internal circuitry. Stated differently, the wide divergence between the holding voltage, the turn-on voltage, and the breakdown voltage of the ESD protection device means that the ESD protection device may violate or fall outside one or more of the specification limits, which is undesirable and may result in failure or damage to the IC chip. In addition, the burn-in voltage, breakdown voltage, and the holding voltage may vary from device to device as well. Thus, even if one device passes the specification (within the specification limits), the other devices may still fall outside the specification limits. Furthermore, if VDD happens to be greater than the holding voltage Vh, undesirable latch-up may occur.

Figure 19:
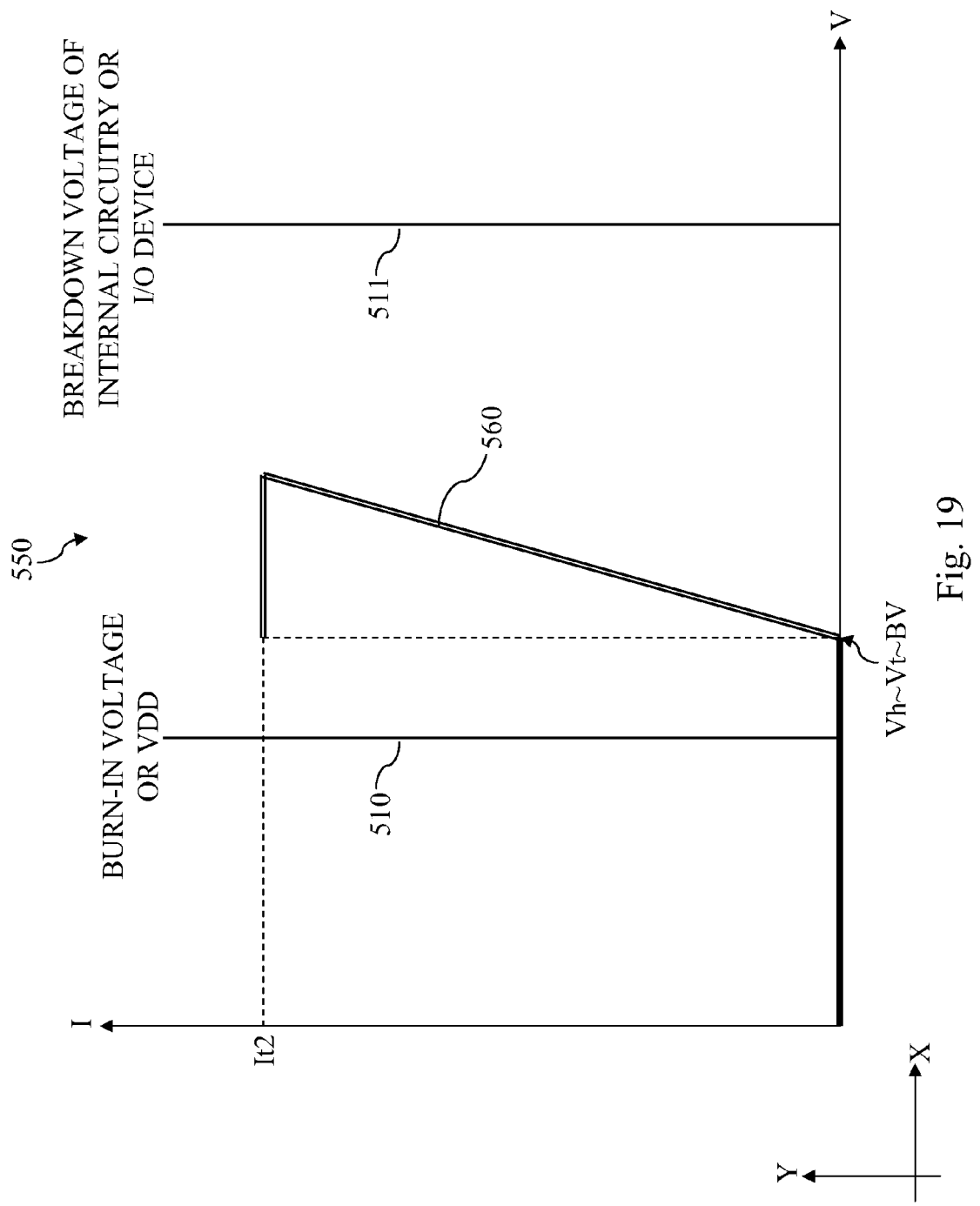

Referring to FIG. 19, a graph 550 is provided, which illustrates the I-V behavior for an example ESD protection device fabricated according to various aspects of the present disclosure. The graph 550 still shows the burn-in voltage 510 and the breakdown voltage of the internal IC circuitry 511 as the specification limits. The I-V behavior of the ESD protection device is shown as a plot curve 560. As can be seen, by tuning the layout parameters (e.g., distances 300 and 310, shown in FIG. 2), the difference between the holding voltage Vh, breakdown voltage BV, and the turn-on voltage Vt is substantially minimized. In other words, the voltages Vh, BV, and Vt may be substantially equal to one another. Therefore, it is much easier to control the behavior of the ESD protection device to make sure that all of these voltages Vh, Vt, and BV fall within the specification limits—since if one of them falls within the specification limits, the other ones are most likely within the specification limits too. In this manner, the tuning range of the ESD protection device is drastically increased. The tuning range for the voltages Vh, Vt, and BV is now almost as wide as the difference between the specification limits 510 and 511. The undesirable variance between different types of devices is also unlike to cause failure due to the increased tuning range. In addition, if Vh is tuned to be greater than VDD, that will substantially eliminate the latch-up problems.

One of the broader forms of the present disclosure involves an apparatus. The apparatus includes a BJT device. The BJT device includes: a collector disposed in a substrate, the collector including: a first doped element and a second doped element disposed over the first doped element, wherein the first and second doped elements each have a first doping polarity, and wherein the second doped element has a greater doping concentration level than the first doped element; a base disposed in the substrate and adjacent to the collector, the base including: a third doped element having a second doping polarity different from the first doping polarity, wherein a p-n junction is formed between the third doped element and one of the first and second doped elements; and an emitter disposed over the base, the emitter including a fourth doped element having the first doping polarity, wherein the fourth doped element has a greater doping concentration level than the third doped element.

Another one of the broader forms of the present disclosure involves an ESD protection device. The ESD protection device includes: a substrate; a collector component of a bipolar junction transistor (BJT) device formed in the substrate, wherein the collector component is progressively doped in a manner such that a portion of the collector component closer to the surface of the substrate is more heavily doped than a portion of the collector component further away from the surface of the substrate; a base component of the BJT device formed in the substrate, the base component forming a first p-n junction with the collector component; and an emitter component of the BJT device formed on the base component, the emitter component forming a second p-n junction with the base component; wherein the base component is oppositely doped from the collector component and the emitter component.

Another one of the broader forms of the present disclosure involves an ESD protection device. The ESD protection device includes a BJT device. The BJT device includes: a bipolar junction transistor (BJT) device, the BJT device including: a first p-n interface formed by a collector of the BJT device and a base of the BJT device, the collector including a plurality of doped features all having the same doping polarity but different doping concentration levels, the base being laterally disposed with respect to the collector and including one or more doped features; and a second p-n interface formed by the base and an emitter of the BJT device, the emitter being vertically disposed with respect to the base and including a doped feature formed above the base, the emitter having a greater doping concentration level than the base therebelow; wherein: the doped features of the base are of an opposite doping polarity from the doped features of the collector and the emitter; and a turn-on voltage, a breakdown voltage, and a holding voltage of the BJT device are each correlated with a layout parameter of the BJT device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
    a bipolar junction transistor (BJT) device that includes:
        a collector disposed in a substrate, the collector including: a first doped element and a second doped element disposed over the first doped element, wherein the first and second doped elements each have a first doping polarity, and wherein the second doped element has a greater doping concentration level than the first doped element;

a base disposed in the substrate and adjacent to the collector, the base including: a third doped element having a second doping polarity different from the first doping polarity, wherein a p-n junction is formed between the third doped element and one of the first and second doped elements; and an emitter disposed over the base, the emitter including a fourth doped element having the first doping polarity, wherein the fourth doped element has a greater doping concentration level than the third doped element.

2. The apparatus of claim 1, wherein:
the collector further includes a fifth doped element disposed over the second doped element;
the fifth doped element has the first doping polarity; and
the fifth doped element has a greater doping concentration level than the second doped element.

3. The apparatus of claim 1, wherein:
the base further includes a sixth doped element disposed over the third doped element;
the sixth doped element has the second doping polarity;
the sixth doped element has a greater doping concentration level than the third doped element; and
another p-n junction is formed between the fourth doped element and the sixth doped element.

4. The apparatus of claim 1, wherein:
the first doping polarity is a p-type doping polarity; and
the second doping polarity is an n-type doping polarity.

5. The apparatus of claim 1, wherein the collector and the base are each disposed over a buried layer, the buried layer having the second doping polarity.

6. The apparatus of claim 1, wherein the base has a pickup type that is one of: a ring type, a band type, a dot type, and a floating type.

7. The apparatus of claim 1, wherein:
a first distance extends from the p-n junction into a region of the collector;
a second distance extends from the p-n junction into a region of the emitter; and
the first and second distances are tuned in a manner so that a breakdown voltage, a turn-on voltage, and a holding voltage of the BJT device are substantially the same.

8. The apparatus of claim 1, wherein the emitter and collector are separated by a dielectric isolation structure.

9. The apparatus of claim 1, wherein the apparatus is an electrostatic discharge (ESD) protection device, and wherein the ESD device is electrically coupled with electronic circuitry inside an integrated circuit (IC) chip.

10. An electrostatic discharge (ESD) protection device, comprising:
a substrate;
a collector component of a bipolar junction transistor (BJT) device formed in the substrate, wherein the collector component is progressively doped in a manner such that a portion of the collector component closer to the surface of the substrate is more heavily doped than a portion of the collector component further away from the surface of the substrate;
a base component of the BJT device formed in the substrate, the base component forming a first p-n junction with the collector component; and
an emitter component of the BJT device formed on the base component, the emitter component forming a second p-n junction with the base component;
wherein the base component is oppositely doped from the collector component and the emitter component.

11. The ESD protection device of claim 10, wherein the collector component contains a heavily doped region formed at the surface of the substrate.

12. The ESD protection device of claim 11, wherein the collector component further contains an additional doped region formed below the heavily doped region, the additional doped region being less doped than the heavily doped region.

13. The ESD protection device of claim 12, wherein the collector component further contains a high voltage well, the high voltage well being less doped than the additional doped region.

14. The ESD protection device of claim 10, wherein the base component contains a high voltage well and a doped region formed over the high voltage well, the high voltage well being less doped than the doped region.

15. The ESD protection device of claim 14, wherein:
the first p-n junction is formed by the collector component and the high voltage well; and
the second p-n junction is formed by the base component and the doped region.

16. The ESD protection device of claim 10, wherein the collector component and the base component are each formed over a buried well, the buried well being oppositely doped from the collector component.

17. The ESD protection device of claim 10, wherein a location of the first p-n junction is tuned in a manner such that a turn-on voltage, a breakdown voltage, and a holding voltage of the BJT device are approximately equal.

18. An electrostatic discharge (ESD) protection device, comprising:
a bipolar junction transistor (BJT) device, the BJT device including:
a first p-n interface formed by a collector of the BJT device and a base of the BJT device, the collector including a plurality of doped features all having the same doping polarity but different doping concentration levels, the base being laterally disposed with respect to the collector and including one or more doped features; and
a second p-n interface formed by the base and an emitter of the BJT device, the emitter being vertically disposed with respect to the base and including a doped feature formed above the base, the emitter having a greater doping concentration level than the base therebelow;
wherein:
the doped features of the base are of an opposite doping polarity from the doped features of the collector and the emitter; and
a turn-on voltage, a breakdown voltage, and a holding voltage of the BJT device are each correlated with a layout parameter of the BJT device.

19. The ESD protection device of claim 18, wherein the layout parameter is controlled in a manner such that the turn-on voltage, the breakdown voltage, and the holding voltage of the BJT device have approximately the same values.

20. The ESD protection device of claim 18, wherein the layout parameter includes at least one of:
a first distance measured from the first p-n interface to one of the doped features of the collector; and
a second distance measured from the first p-n interface to one of the doped features of the base.

* * * * *